United States Patent [19]

Isogai

[11] Patent Number: 5,847,381

[45] Date of Patent: Dec. 8, 1998

[54] PHOTOELECTRIC CONVERSION APPARATUS HAVING A LIGHT-SHIELDING SHUNT LINE AND A LIGHT-SHIELDING DUMMY LINE

[75] Inventor: Tadao Isogai, Yokohama, Japan

[73] Assignee: Nikon Corporation, Tokyo, Japan

[21] Appl. No.: 820,285

[22] Filed: Mar. 18, 1997

[30] Foreign Application Priority Data

Mar. 18, 1996 [JP] Japan .................................. 8-090516

[51] Int. Cl.[6] .............................................. H01L 27/00
[52] U.S. Cl. ...................................... 250/208.1; 257/292
[58] Field of Search ......................... 250/208.1; 257/292, 257/258, 443; 348/302, 305

[56] References Cited

U.S. PATENT DOCUMENTS

| | | | |
|---|---|---|---|
| 4,942,474 | 7/1990 | Akimoto et al. | 358/213.11 |
| 5,043,783 | 8/1991 | Matsumoto et al. | 357/30 |
| 5,172,249 | 12/1992 | Hashimoto | 358/482 |
| 5,563,429 | 10/1996 | Isogai | 257/292 |

FOREIGN PATENT DOCUMENTS 5-235317  9/1993  Japan .
5-275670  10/1993  Japan .

*Primary Examiner*—Edward P. Westin
*Assistant Examiner*—Kevin Pyo
*Attorney, Agent, or Firm*—Foley & Lardner

[57] ABSTRACT

Photoelectric conversion elements, each of which comprises a field effect transistor, are arranged in a two-dimensional matrix. The drain regions of the field effect transistors are continuously formed like a mesh so as to be commonly connected together in the row and column directions. Light-shielding drain shunt lines commonly connecting the drain regions of the field effect transistors along the column direction are formed at a rate of 1 line to a plurality of columns. Electrically floating light-shielding dummy lines having no connection to the drain regions of the field effect transistors are formed in the columns where no drain shunt lines are formed. Thus, high yield in manufacture is attained, while sensitivity is prevented from fluctuating.

6 Claims, 18 Drawing Sheets

PHOTOELECTRIC CONVERSION APPARATUS HAVING A LIGHT-SHIELDING SHUNT LINE AND A LIGHT-SHIELDING DUMMY LINE

BACKGROUND OF THE INVENTION

1. Field of the Invention

The present invention relates to a photoelectric conversion apparatus comprising photoelectric conversion elements which are arranged in a two-dimensional matrix.

2. Related Background Art

Amplification type photoelectric conversion elements utilizing transistors, which have conventionally been proposed in order to enhance the sensitivity of photoelectric conversion apparatus (including solid-state imaging apparatus and the like), include MOS (normally of depletion type), bipolar, and junction type field effect transistor (JFET). In these photoelectric conversion elements, light incident on a MOS diode (in the MOS type) or a pn junction diode (in the bipolar or JFET type), which is a part of constituents of the photoelectric conversion element, is photoelectrically converted into and stored as a charge corresponding thereto, a signal corresponding to thus stored charge is amplified (by current amplification or charge amplification), and then thus amplified signal is transmitted therefrom.

Of the above-mentioned photoelectric conversion elements, there is a photoelectric conversion element which performs all the operations including those of photoelectric conversion, amplification, and initialization by a single transistor (i.e., photoelectric conversion element constituted by a single transistor). Such a photoelectric conversion element, however, has two kinds of tendencies. Here, the initialization operation refers to an operation for setting the potential of a control region of the transistor to a certain reference value or an operation for completely depleting the control region. Also, the control region of the transistor refers to a region for controlling the current, which is a gate diffusion region in the JFET and a base diffusion region in the bipolar transistor, for example.

The first tendency is increase in noise of the photoelectric conversion portion. For example, in the MOS type, photoelectric conversion is normally effected by a MOS diode whose gate electrode is made of polysilicon. At the time of this photoelectric conversion, the silicon surface side is depleted, whereby the MOS diode is directly affected by a large dark current generated on the surface, yielding an increase in noise. Also, it tends to have a low light-utilizing efficiency (quantum efficiency) due to a low transmittance of light in polysilicon.

The bipolar type and JFET type devices which effect photoelectric conversion by means of the pn junction diode are also subject to a constraint that a part of the constituents of the above-mentioned transistor must be utilized. Accordingly, they cannot realize an ideal diode structure such as a buried photodiode suitably used in a CCD type image pickup element or the like (i.e., a depletion layer generated from the pn junction portion reaches the surface in cases of the bipolar and JFET type devices). Consequently, they are affected by the dark current, thereby increasing noise.

Normally, in these pn junction diodes, the charges generated and stored thereby are recombined by a transient and considerably deep forward bias drive due to capacitive coupling, whereby a reset operation is effected. Such a reset method tends to generate reset noise and image lag.

Further, when resetting the charge generated and stored thereby and when suppressing blooming (bleeding), the transistor also operates (is turned on), whereby a large current flows into the transistor itself constituting the photoelectric conversion element. Accordingly, the bias point (operating point) of the transistor tends to transiently fluctuate by a large amount, thereby changing the amplification factor. When a number of such photoelectric conversion elements are arranged, for example, so as to constitute a photoelectric conversion apparatus, the outputs of the respective photoelectric conversion elements tend to fluctuate, thereby lowering the performance (i.e., S/N ratio) of the apparatus, and the power consumption tends to increase due to the number of photoelectric conversion elements arranged.

The second tendency is that the sensitivity cannot be set so high. Fundamentally, the above-mentioned various types (MOS, bipolar, and JFET types) of transistors (photoelectric conversion elements) effect current amplification or charge amplification by utilizing a change in potential caused when a charge generated upon photoelectric conversion is stored in the control region which is in a floating state. Namely, amplified outputs are obtained by means of the change in surface potential of silicon under the gate electrode, change in potential of the base region, and change in potential of the gate region respectively in the depletion type MOS transistor, bipolar type device, and JFET type device.

Accordingly, in order to attain a high sensitivity, it is necessary for the amount of potential change (stored charge amount/capacitance) to increase. For this purpose, the capacitance of the control region is preferably as small as possible. In order to increase the utilization efficiency of incident light and the amount of charge, however, the area of the photoelectric conversion portion (light-receiving aperture ratio) should be as large as possible. Nevertheless, in the photoelectric conversion element effecting all the operations (such as photoelectric conversion, amplification, and initialization) by a single transistor, since the control region is the photoelectric conversion portion itself, the capacitance increases as the aperture ratio is higher. As a result, the sensitivity cannot have been made so high.

On the other hand, there have been proposed photoelectric conversion elements in which the photoelectric conversion portion and the amplifying transistor are separated from each other, the charge generated and stored in the photoelectric conversion portion is transferred to the control region of the transistor by way of a transfer gate of a transfer control portion, and thus transferred charge is subjected to current amplification or charge amplification so as to yield an output. For example, Japanese Patent Application Laid-Open Nos. 5-235317 and 5-275670 disclose a photoelectric conversion element in which an amplifying portion adopting a depletion type MOS or JFET is combined with a photodiode and a transfer control portion (transfer gate).

When a buried photodiode is used as the photoelectric conversion portion in the photoelectric conversion element in which the photoelectric conversion portion and the amplifying transistor are separated from each other while a transfer gate is provided, the photoelectric conversion element can be realized with a high quantum efficiency while being free of image lag, dark current, reset noise, and the like.

Also, when a buried photodiode of a vertical overflow structure is used for the photoelectric conversion portion, since the photodiode has a blooming-suppressing function, it becomes unnecessary for the amplifying transistor to suppress blooming. Accordingly, overcome is the tendency that (when a photoelectric conversion apparatus is constituted, for example) the power consumption increases or outputs of the respective photoelectric conversion elements fluctuate due to variations in the bias point (operating point).

Further, since the photoelectric conversion portion and the amplifying transistor are separated from each other, the structure and size of the transistor can be optimized in view of its amplifying function alone. Accordingly, the capacitance of the control section can be reduced so as to secure a high sensitivity.

In addition, new tendencies concerning the dark current, after-image, reset noise, and the like generated by the transistor itself can be improved by the configuration and driving method of the photoelectric conversion apparatus in which the photoelectric conversion elements are arranged in a matrix.

Thus, the photoelectric conversion element in which the photoelectric conversion portion and the amplifying transistor are separated from each other while a transfer gate is provided can yield a lower noise and a higher sensitivity as compared with the conventional photoelectric conversion element in which all the operations (such as photoelectric conversion, amplification, and initialization) are effected by a transistor.

SUMMARY OF THE INVENTION

It is an object of the invention to provide a photoelectric conversion apparatus which attains a high yield in manufacture and prevents sensitivity from fluctuating.

The photoelectric conversion apparatus in accordance with the present invention comprises a plurality of photoelectric conversion elements arranged in a two-dimensional matrix defined by a row direction and a column direction, each photoelectric conversion element being provided with a photoelectric conversion portion for generating and storing a charge corresponding to an intensity of light received thereby, and an amplifying portion which has a control region and outputs a signal corresponding to the charge received from the photoelectric conversion portion at the control region; a light-shielding shunt line commonly connecting the amplifying portions along the column direction, one shunt line being formed for a plurality of columns; and a light-shielding dummy line which is electrically floating without connecting with the amplifying portions, the dummy line being formed in a column which is free of the shunt line.

In the photoelectric conversion apparatus of the present invention, shunt lines are formed at a rate of 1 line to a plurality of columns, whereas dummy lines are formed in the columns where no shunt lines are formed. The dummy lines are electrically floating and connect with neither the amplifying portions nor power supply. Accordingly, even when electric connection is established between a dummy line and a signal line, between a dummy line and a relay line, or the like due to particles or the like during a manufacturing process, no problem of short-circuiting occurs between lines. Accordingly, in the photoelectric conversion apparatus of the present invention, since the shunt lines are reduced as the dummy lines substitute therefor, the high yield in manufacture is attained. Also, when at least the part of dummy lines contributory to photosensitivity is made to have a pattern form identical to that of the shunt lines, the aperture ratio of the pixels in the columns where the dummy lines are formed and that of the pixels in the columns where the shunt lines are formed do not differ from each other. Accordingly, in the photoelectric conversion apparatus of the present invention, sensitivity can be prevented from fluctuating.

In the photoelectric conversion apparatus of the present invention, the dummy lines may be formed continuously along the column direction.

Also, the photoelectric conversion apparatus of the present invention may further comprise a light-shielding film extending along the row direction provided for each row, while the dummy lines may be intermittently formed in the column direction so as to be missing in at least a part of the region of each row intersecting with the light-shielding film.

In this case, the dummy lines are cut in the column direction by pixel pitches, whereby the length of the dummy lines is remarkably reduced. Also, since the dummy lines are missing at the intersection regions with respect to the light-shielding films where wiring is most congested, the wiring space is broadened in this region. Accordingly, a dummy line and a signal line or a dummy line and a relay line, for example, can connect with each other less frequently, thereby maintaining the low probability at which short-circuiting occurs between the signal line and the relay line by way of one dummy line, for example. Also, since the dummy lines are cut with fine pitches, the parasitic capacitance of the dummy lines is small. Accordingly, even when connected to a signal line or a relay line, they hardly affect the operating speed or the like. Also, since the dummy lines are missing at the regions intersecting with the light-shielding film, i.e., regions which are not contributory to photosensitivity, the aperture ratio does not change, and the sensitivity does not fluctuate.

In the photoelectric conversion apparatus of the present invention, the amplifying portion may comprise a field effect transistor, and the light shielding-shunt line commonly connects the drain region of the field effect transistor.

Namely, the amplifying portion is preferably constituted by one which restrains fixed pattern noise from occurring due to signal (charge) destruction. For this purpose, the amplifying portion preferably comprises a field effect transistor (FET) which nondestructively amplifies the charge (signal charge) generated and stored by the photoelectric conversion portion.

Here, without being restricted to the field effect transistor, the amplifying portion may comprise a bipolar transistor, for example. When the amplifying portion comprises the bipolar transistor, the light shielding-shunt line commonly connects the collector regions, for example.

Preferably, in the photoelectric conversion apparatus of the present invention, the photoelectric conversion element further comprises a transfer control portion for transferring the charge generated and stored in the photoelectric conversion portion to the control region of the amplifying portion; reset-purpose charge draining means for draining the charge transferred to the control region of the amplifying portion; and reset-purpose control means for controlling the reset-purpose charge draining means.

In this case, since the reset-purpose charge draining means for initializing the control region of the amplifying portion and the reset-purpose control means are provided separately from and independently of the amplifying portion, the amplifying portion does not operate at the time of reset operation. Accordingly, overcome is the problem of the conventional photoelectric conversion element that a large current flows into the amplifying portion itself upon a reset operation and thereby transiently fluctuating the bias point (operating point) of the amplifying portion by a large amount so as to change the amplification factor.

Further, the light-shielding film may be a row-selecting line which commonly connect reset portions along the row direction.

In this case, the row-selecting line also functions as the light-shielding film. Accordingly, it becomes unnecessary for the light-shielding film to be formed in order to block the incident light. Therefore, the thickness of the whole photoelectric conversion element can be made thin so as to improve the degree of integration, while the metal line/light-shielding film can be disposed near the photoelectric conversion portion, whereby bleeding phenomena such as blooming due to obliquely incident light can be suppressed.

Preferably, in the photoelectric conversion apparatus of the present invention, the photoelectric conversion element further comprises control means for controlling the control region of the amplifying portion by means of capacitive coupling.

The amplifying portion of the photoelectric conversion element is often provided with control means for controlling the control region of the amplifying portion by means of capacitive coupling.

Preferably, in the photoelectric conversion apparatus of the present invention, element isolation regions of a predetermined conductivity type are formed between respective mutual regions of the photoelectric conversion portion, transfer control portion, reset-purpose draining means, and reset-purpose control means in the photoelectric conversion element.

Namely, while the isolation areas between the respective mutual regions of the photoelectric conversion portion, transfer control portion, reset-purpose draining means, and reset-purpose control means are desirably as small as possible from the viewpoints of aperture ratio and degree of integration in general, it is difficult for the isolation areas to decrease, since they are influenced by so-called side diffusion of dopant (impurity) in the process of manufacturing the photoelectric conversion element.

Accordingly, when element isolation regions of a predetermined conductivity type are formed between the respective mutual regions of the photoelectric conversion portion, transfer control portion, reset-purpose draining means, and reset-purpose control means so as to make the isolation areas between the mutual regions as small as possible, the aperture ratio and degree of integration can be improved.

Preferably, in the photoelectric conversion apparatus of the present invention, the metal line connected to the reset-purpose charge draining means in the photoelectric conversion element is formed of a light-shielding film which blocks light incident on the amplifying portion, transfer control portion, reset-purpose charge draining means, and reset-purpose control means.

Namely, the metal line also functions as the light-shielding film. Accordingly, it becomes unnecessary for a dedicated light-shielding film to be formed in order to block the incident light. Therefore, the thickness of the whole photoelectric conversion element can be made thin so as to improve the degree of integration, while the metal line/light-shielding film can be disposed near the photoelectric conversion portion, whereby bleeding phenomena such as blooming due to obliquely incident light can be suppressed.

In the photoelectric conversion apparatus of the present invention, the photoelectric conversion portion in the photoelectric conversion element may comprise a pn junction photodiode of a vertical overflow drain structure.

Namely, the photoelectric conversion element may be constituted by a pn junction photodiode of a vertical overflow drain structure. Accordingly, when the photoelectric conversion portion is constituted by a pn junction photodiode of a vertical overflow drain structure, bleeding phenomena such as blooming and smear can be suppressed.

In the photoelectric conversion apparatus of the present invention, the photoelectric conversion portion in the photoelectric conversion element may comprise a buried photodiode of a vertical overflow drain structure.

The photoelectric conversion element may be constituted by a buried photodiode of a vertical overflow drain structure. Accordingly, when the photoelectric conversion portion is constituted by a buried photodiode of a vertical overflow drain structure, ideal characteristics in which not only the bleeding phenomena such as blooming and smear but also dark current, image lag, and reset noise are suppressed can be obtained.

In the photoelectric conversion apparatus of the present invention, the amplifying portion in the photoelectric conversion element may comprise a junction field effect transistor (JFET), while a channel forming portion of the junction field effect transistor (JFET) may be formed by a first conductivity type gate region, a second conductivity type channel region, and a first conductivity type semiconductor substrate which are successively disposed from the semiconductor surface toward the inside of the semiconductor substrate.

The amplifying portion of the photoelectric conversion element may be constituted by a junction field effect transistor (JFET), while the channel forming portion of this junction field effect transistor (JFET) is formed by the first conductivity type gate region, the second conductivity type channel region, and the first conductivity type semiconductor substrate which are successively disposed from the semiconductor surface toward the inside of the semiconductor substrate. Accordingly, when the charge (signal charge) is amplified, it is amplified by way of the first conductivity type gate region and the second conductivity type channel region.

In the photoelectric conversion apparatus of the present invention, the amplifying portion in the photoelectric conversion element may comprise a junction field effect transistor (JFET), while a channel forming portion of the junction field effect transistor (JFET) may be formed by a first conductivity type shallow gate region, a second conductivity type shallow channel region, a first conductivity type gate region, a second conductivity type well region, and a first conductivity type semiconductor substrate which are successively disposed from the semiconductor surface toward the inside of the semiconductor substrate.

The amplifying portion in the photoelectric conversion element may be constituted by a junction field effect transistor (JFET), while the channel forming portion of this junction field effect transistor (JFET) is formed by the first conductivity type shallow gate region, the second conductivity type shallow channel region, the first conductivity type gate region, the second conductivity type well region, and the first conductivity type semiconductor substrate which are successively disposed from the semiconductor surface toward the inside of the semiconductor substrate.

Namely, the channel forming portion is shallowed (forms a shallow junction) due to the first conductivity type shallow gate region and the second conductivity type shallow channel region, thereby reducing the size of the whole junction field effect transistor. Also, the first conductivity type gate region and the first conductivity type semiconductor substrate are electrically separated from each other by the second conductivity type well region interpolated therebetween.

Accordingly, transconductance is improved by shallowing, while the degree of integration and aperture ratio increase as the size of the whole transistor is smaller, whereby a higher sensitivity can be obtained. Also, as the gate region (control region) of the junction field effect transistor (JFET) and the semiconductor substrate are electrically separated from each other, the influence of the substrate voltage (substrate bias effect) can be suppressed so as to improve the amplification factor at the time of current-amplifying operation and the charge amplification factor at the time of source-follower operation.

In the photoelectric conversion apparatus of the present invention, the amplifying portion in the photoelectric conversion element may comprise a junction field effect transistor (JFET), while a channel forming portion of the junction field effect transistor (JFET) may be formed by a first conductivity type shallow gate region, a second conductivity type shallow channel region, a first conductivity type gate region, a second conductivity type well region, and a first conductivity type semiconductor substrate which are successively disposed from the semiconductor surface toward the inside of the semiconductor substrate, and the first conductivity type shallow gate region and the first conductivity type gate region are electrically connected to each other in a portion different from the channel forming portion.

The amplifying portion in the photoelectric conversion element may be constituted by a junction field effect transistor (JFET), while the channel forming portion of the junction field effect transistor (JFET) is formed by the first conductivity type shallow gate region, the second conductivity type shallow channel region, the first conductivity type gate region, the second conductivity type well region, and the first conductivity type semiconductor substrate which are successively disposed from the semiconductor surface toward the inside of the semiconductor substrate, and the first conductivity type shallow gate region and the first conductivity type gate region are electrically connected to each other in a portion different from the channel forming portion.

Accordingly, transconductance is improved by shallowing, while the degree of integration and aperture ratio increase as the size of the whole transistor is smaller, whereby a higher sensitivity can be obtained. Also, as the first conductivity type shallow gate region and the first conductivity type gate region are electrically connected to each other, while the gate region (control region) of the junction field effect transistor (JFET) and the semiconductor substrate are electrically separated from each other, the influence of the substrate voltage (substrate bias effect) can be greatly suppressed so as to improve the amplification factor at the time of current-amplifying operation and the charge amplification factor at the time of source-follower operation.

Preferably, in the photoelectric conversion apparatus of the present invention, the photoelectric conversion portion in the photoelectric conversion element is a buried photodiode of a vertical overflow drain structure; the amplifying portion in the photoelectric conversion element is a junction field effect transistor; the channel forming portion of the junction field effect transistor is formed by a first conductivity type shallow gate region, a second conductivity type shallow channel region, a first conductivity type gate region, a second conductivity type well region, and a first conductivity type semiconductor substrate which are successively disposed from the semiconductor surface toward the inside of the semiconductor substrate; the first conductivity type shallow gate region and the first conductivity type gate region are electrically connected to each other in a portion different from the channel forming portion; and the first conductivity type gate region has an impurity concentration different from that in the charge storing portion of the buried photodiode. In this case, the buried photodiode and the junction field effect transistor can be operated under favorable conditions.

Here, it is preferred that the impurity concentration in the first conductivity type gate region in the photoelectric conversion element be set within the range of $6 \times 10^{15}$ cm$^{-3}$ to $3 \times 10^{16}$ cm$^{-3}$, while the impurity concentration in the charge storing portion in the buried photodiode be set within the range of $5 \times 10^{15}$ cm$^{-3}$ to $3 \times 10^{16}$ cm$^{-3}$. In this case, the buried photodiode and the junction field effect transistor can be operated under optimal conditions.

In the photoelectric conversion apparatus of the present invention, the amplifying portion in the photoelectric conversion element may comprise a depletion type MOS field effect transistor.

In this case, the fixed pattern noise based on signal (charge) destruction can be suppressed. Also, since neither reset noise nor image lag occurs in the MOS field effect transistor at the time of reset operation of its control region, this arrangement is suitable for constituting a photoelectric conversion element enabling an electronic shutter operation.

In the photoelectric conversion apparatus of the present invention, the amplifying portion in the photoelectric conversion element may comprise a bipolar transistor, while the bipolar transistor has a collector made of a high-concentration region of a predetermined conductivity type formed in a silicon surface layer portion so as to surround the photoelectric conversion element, without any formation of a buried collector or a collector using a high-concentration substrate of a predetermined conductivity type.

In this case, the bipolar transistor and the photodiode of a vertical overflow drain structure can be combined together, whereby pseudo signals such as blooming and smear can be suppressed.

Preferably, in the photoelectric conversion apparatus of the present invention, the reset-purpose charge draining means of the respective photoelectric conversion elements aligned in at least one direction, e.g., in the horizontal readout direction, are disposed in parallel to each other.

In this case, as the reset-purpose charge draining means of the respective photoelectric conversion elements aligned in the horizontal readout direction are disposed in parallel to each other, the amplifying portion and the reset portion always correspond to each other in each unit pixel of the photoelectric conversion element, whereby the control region of the amplifying portion can be initialized to the potential of the reset portion in a very short time. Namely, the reset operation can be performed at a high speed.

The photoelectric conversion apparatus of the present invention may further comprise a vertical scanning circuit and a pulse drive source, wherein the transfer-purpose control means of the transfer control portions and the reset-purpose charge draining means in all the photoelectric conversion elements are respectively commonly connected along the horizontal scanning direction so as to connect with the vertical scanning circuit for pulse driving, while the reset-purpose charge draining means in all the photoelectric conversion elements are commonly connected to the pulse drive source.

In thus constituted photoelectric conversion apparatus, first, the vertical scanning circuit applies a high-level voltage to the reset-purpose charge draining means in a certain horizontal line (selected row) and a low-level voltage to the reset-purpose charge draining means in the other horizontal lines (non-selected rows). Then, from the pulse drive source, a drive pulse is applied to all the reset-purpose control means.

As a result, the control regions of the amplifying portions in the photoelectric conversion elements in the selected row are initialized to the high-level voltage, whereas the control regions of the amplifying portions in the photoelectric conversion elements in the non-selected row are initialized to the low-level voltage.

Thus, when the initialization operation for the control regions of the amplifying portions is effected by means of the reset-purpose charge draining means and the reset-purpose control means, unlike the conventional photoelectric conversion apparatus, it is unnecessary to effect a reset operation in which the control regions of the amplifying portions are driven with a forward bias so as to recombine the charges (signal charges).

Accordingly, overcome is a problem that, when a number of photoelectric conversion elements are arranged so as to constitute a photoelectric conversion apparatus, while a large current flows in the amplifying portions, the bias point (operating point) of the amplifying portion transiently fluctuates by a large amount so as to change the amplification factor and whereby the outputs of the respective photoelectric conversion elements fluctuate so as to deteriorate the performance (e.g., S/N ratio) of the apparatus and increase the power consumption.

Here, after the control regions of the amplifying portions are initialized, the drive pulse sent from the vertical scanning circuit is applied to the transfer-purpose control means in the photoelectric conversion elements. As a result, the charges (signal charges) generated and stored in the photoelectric conversion portions in the photoelectric conversion elements are transferred from the photoelectric conversion portions to the control regions of the amplifying portions, and thus transferred charges (signal charges) are subjected to amplification operations in the amplifying portions.

The photoelectric conversion apparatus of the present invention may further comprise a vertical scanning circuit, a pulse drive source, and a power supply; wherein the transfer-purpose control means of the transfer control portions and the control means for controlling the control regions of the amplifying portions by means of capacitive coupling in all the photoelectric conversion elements are respectively commonly connected along the horizontal scanning direction so as to connect with the vertical scanning circuit for pulse driving, while the reset-purpose control means and reset-purpose charge draining means in all the photoelectric conversion elements are respectively commonly connected such that the reset-purpose control means and the reset-purpose charge draining means respectively connect with the pulse drive source and the power supply.

In such a configuration, in order to initialize the control regions of the amplifying portions without operating the amplifying portions, the reset-purpose charge draining means and the reset-purpose control means are provided for the amplifying portions independently thereof and separately therefrom and, in order to perform reset operations at a higher speed, the reset-purpose charge draining means of the respective photoelectric conversion elements aligned along the horizontal readout direction are disposed in parallel to each other. Accordingly, in the configuration such as that mentioned above, the photoelectric conversion apparatus can be manufactured without the configuration of the conventional photoelectric conversion apparatus being greatly changed. Thus, the photoelectric conversion apparatus can be manufactured easily.

Also, in the photoelectric conversion apparatus configured as mentioned above, the voltage is fixedly supplied to the reset-purpose charge draining means from the power supply, and the reset-purpose charge draining means supplies thus supplied voltage to the control regions of the amplifying portions. Also, the reset-purpose control means operates (turns on and off) in response to the drive pulse sent from the pulse drive source. Here, the operations (on and off) of the reset-purpose control means regulate the voltage supplied from the reset-purpose charge draining means to the control regions of the amplifying portions.

Namely, in response to the operations (on and off) of the reset-purpose control means, the voltage is supplied from the reset-purpose charge draining means to the control regions of the amplifying portions. Then, due to the voltage supplied to the control regions of the amplifying portions, the control regions of the amplifying portions are set to the same potential as that of the reset-purpose charge draining means, whereby the control regions of the amplifying portions are initialized.

Accordingly, since the amplifying portions do not operate (do not turn on) at the time of initialization operations thereof, the photoelectric conversion apparatus can overcome the problem that the bias point (operating point) of the amplifying portion transiently fluctuates by a large amount so as to change the amplification factor and whereby the outputs of the respective photoelectric conversion elements fluctuate so as to deteriorate the performance (e.g., S/N ratio) of the apparatus and that the power consumption increases due to a number of photoelectric conversion elements arranged.

In this configuration, the control means based on capacitive coupling is used to enable selecting and non-selecting operations for rows.

The photoelectric conversion apparatus of the present invention may further comprise a vertical scanning circuit, a pulse drive source, and a power supply; wherein the control means for controlling the control regions of the amplifying portions by means of capacitive coupling and the reset-purpose control means in all the photoelectric conversion elements are respectively commonly connected along the horizontal scanning direction so as to connect with the vertical scanning circuit for pulse driving, while the transfer-purpose control means of the transfer portions and the reset-purpose charge draining means in all the photoelectric conversion elements are respectively commonly connected such that the transfer-purpose control means and the reset-purpose control means respectively connect with the pulse drive source and the power supply.

In this case, when the drive pulse sent from the drive pulse source is applied to the transfer-purpose control means of the transfer portions, the charges (signal charges) generated and stored in the photoelectric conversion portions in all the pixels are concurrently transferred to the control regions of the amplifying portions. Then, when the drive pulse sent from the vertical scanning circuit is applied to the control means for regulating the control regions of the amplifying portions by means of capacitive coupling, the amplifying portions execute amplification operations, thereby generating amplified signals therefrom.

Also, the reset-purpose control means operates (turns on and off) according to the drive pulse sent from the vertical scanning circuit, whereby the voltage from the power source connected to the reset-purpose charge draining means is supplied to the control regions of the amplifying portions in response to these operations, so as to set the control regions of the amplifying portions to the same potential as that of the reset-purpose charge draining means, thus initializing them.

Accordingly, the control regions of the amplifying portions can be reset, without operating (turning on) the amplifying portions. Therefore, the performance (e.g., S/N ratio) of the apparatus can be restrained from deteriorating, while the power consumption can be kept from increasing due to a number of photoelectric conversion elements arranged.

Here, this configuration enables an electronic shutter operation which establishes simultaneity in a frame.

The photoelectric conversion apparatus of the present invention may further comprise a vertical scanning circuit for commonly driving the photoelectric conversion elements along a horizontal scanning direction; a first memory portion for storing signal outputs for one horizontal line immediately after the control regions of the amplifying portions are initialized according to vertical scanning; and a second memory portion for storing signal outputs for one horizontal line immediately after the charges are transferred to the control regions of the amplifying portions according to vertical scanning.

In this case, the signal outputs immediately after the control regions of the amplifying portions are initialized include noise components mixed therein, while the signal outputs immediately after the charges (signal charges) generated and stored in the photoelectric conversion portions are transferred to the control regions of the amplifying portions include signal charge components and noise components mixed therein. Accordingly, when the signal outputs immediately after the control regions of the amplifying portions are initialized and the signal outputs immediately after the charges (signal charges) generated and stored in the photoelectric conversion portions are transferred to the control regions of the amplifying portions are separated from each other, and the difference therebetween is extracted, a signal output corresponding to only the signal charge components can be obtained.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
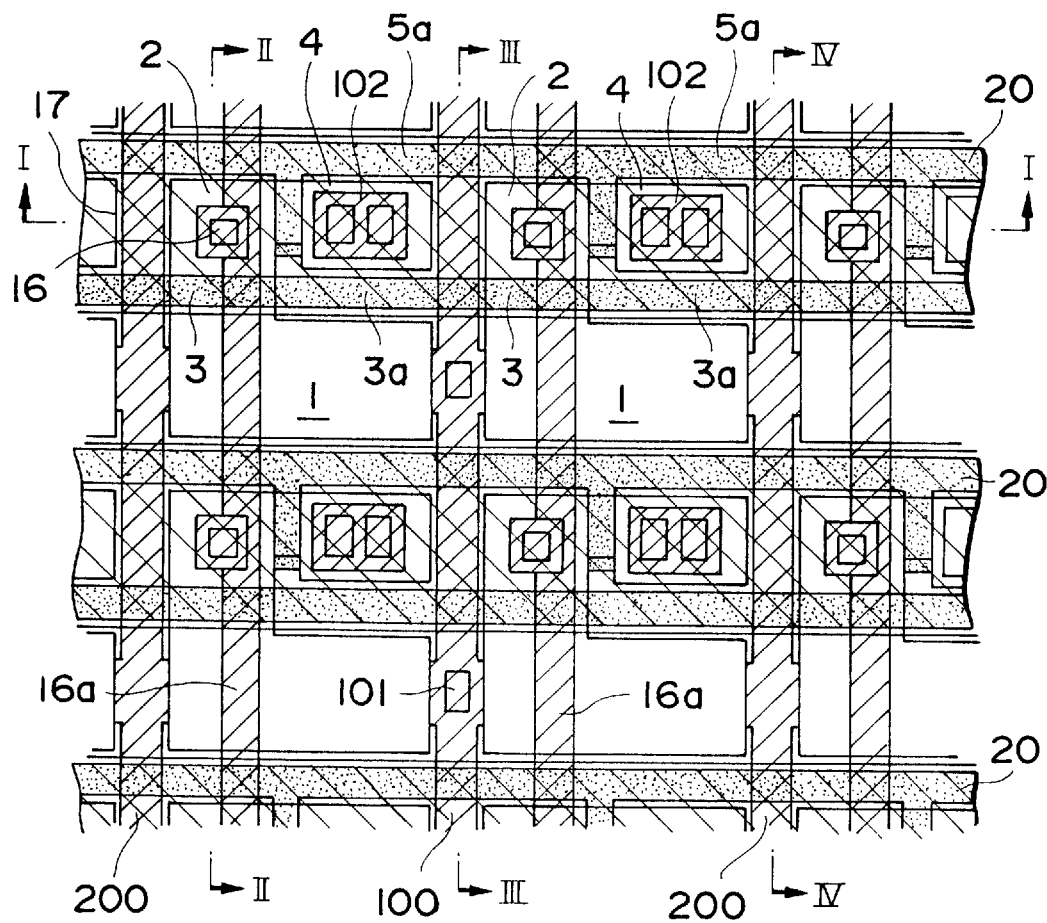
FIGS. 1 to 5 are schematic configurational views showing the photoelectric conversion apparatus in accordance with Embodiment 1 of the present invention.
Figure 5:
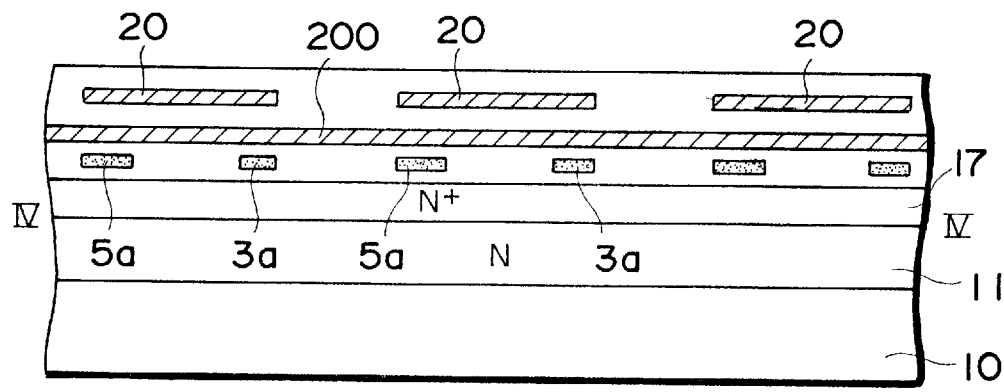

In the following, embodiments of the present invention will be explained with reference to attached drawings. Here, in the drawings showing the embodiments of the present invention, portions identical or equivalent to each other will be referred to with marks identical to each other, without their overlapping descriptions repeated.

Embodiment 1

Figure 6:
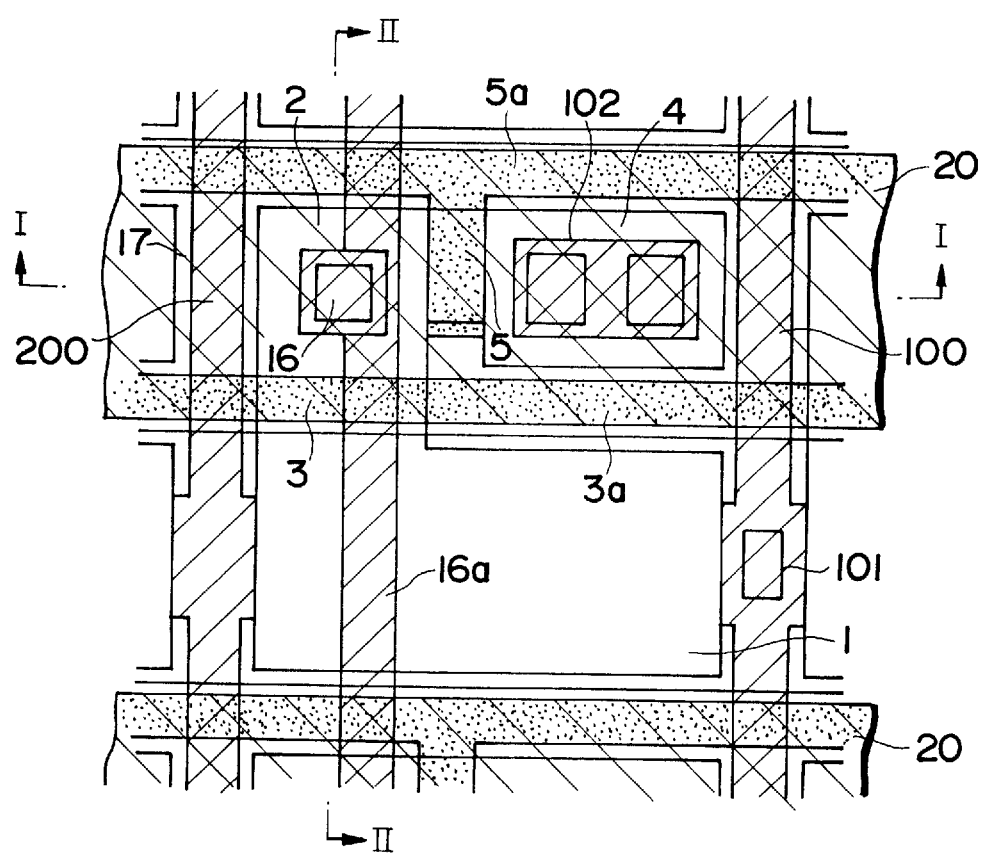
FIGS. 6 to 8 are schematic configurational views showing a unit pixel in the photoelectric conversion apparatus in accordance with Embodiment 1 of the present invention.
Figure 7:
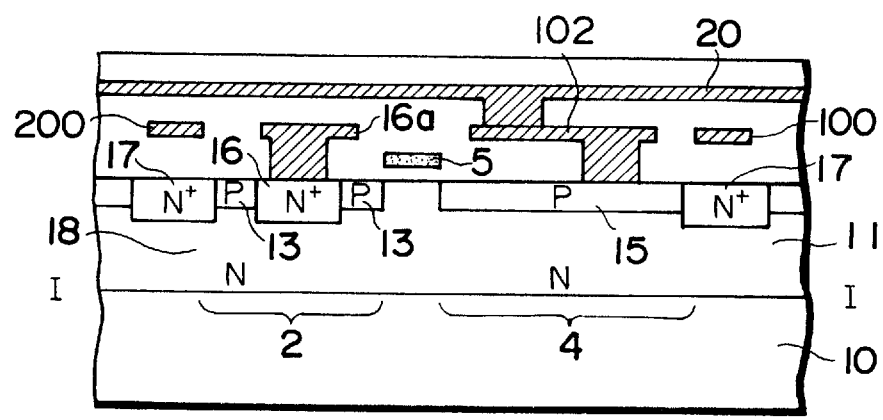
Figure 8:
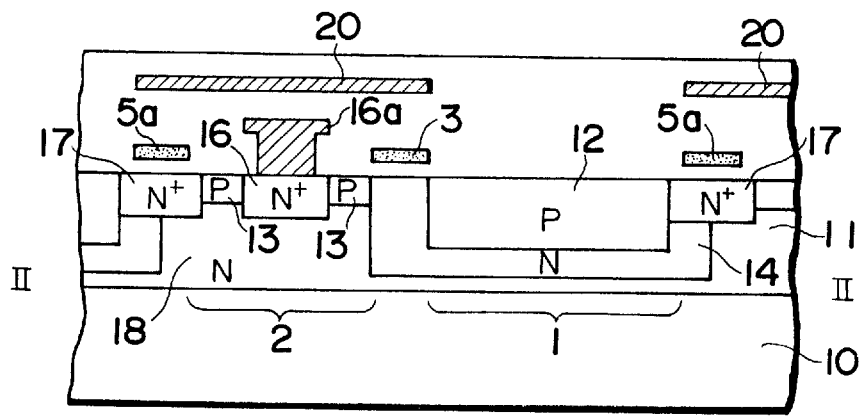
Figure 9:
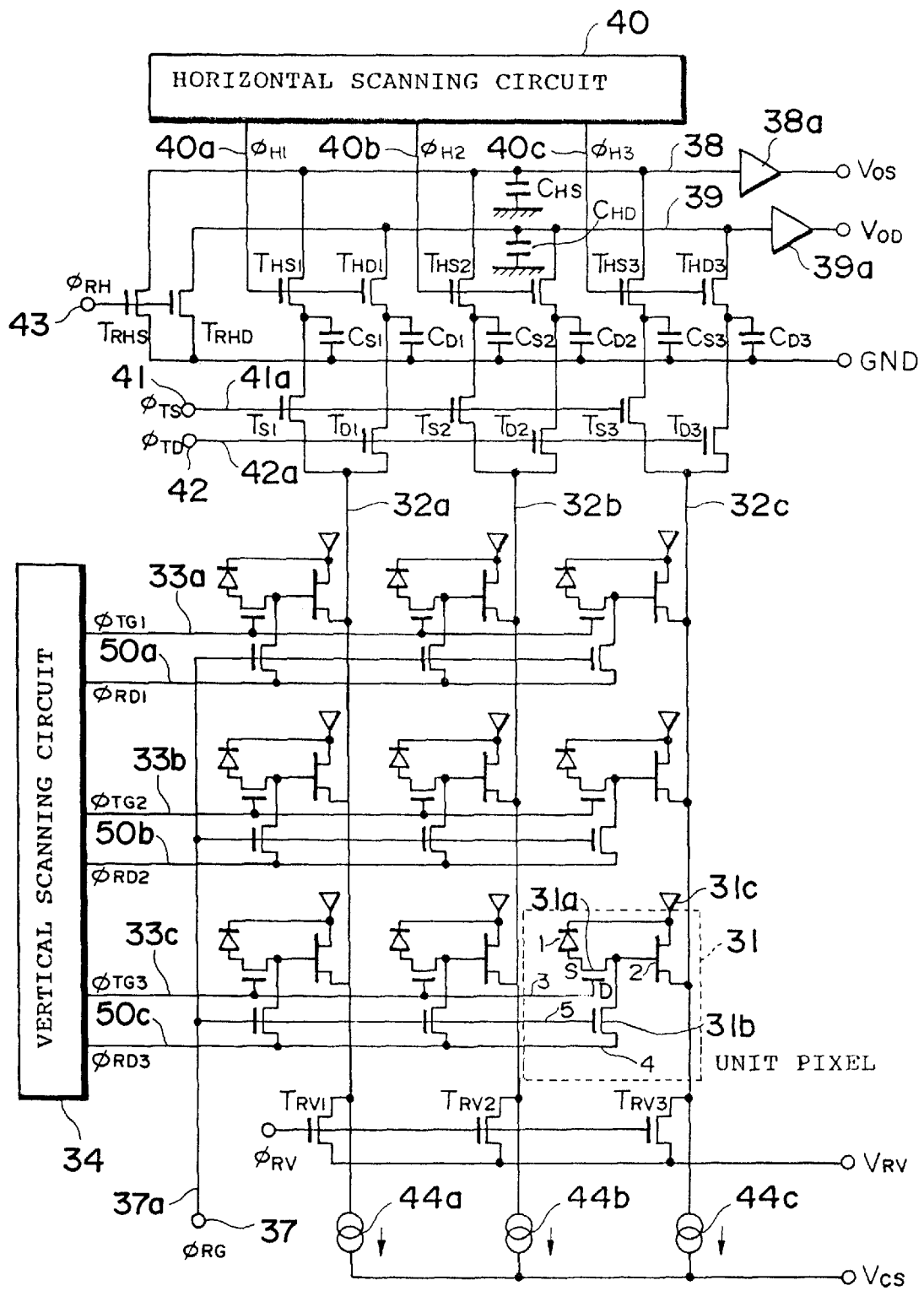
FIG. 9 is a circuit diagram showing the schematic configuration of the photoelectric conversion apparatus in accordance with Embodiment 1 of the present invention.
Figure 10:
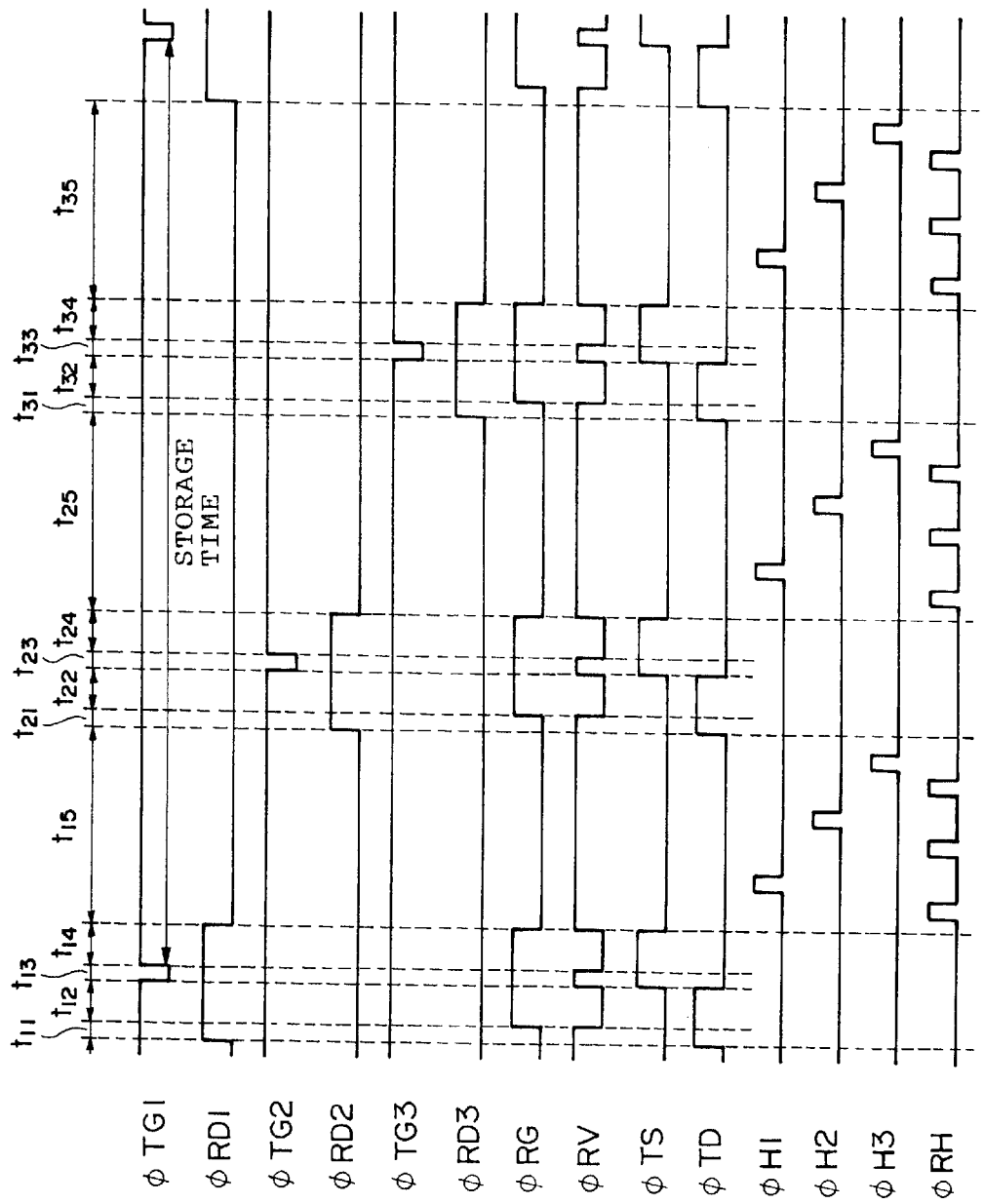
FIG. 10 is a pulse timing chart for explaining the operation of the circuit diagram shown in FIG. 9.

FIG. 1 is a schematic plan view showing the photoelectric conversion apparatus in accordance with Embodiment 1. FIGS. 2 to 5 are schematic cross-sectional views respectively showing cross sections taken along I—I line, II—II line, III—III line, and IV—IV line in FIG. 1. FIGS. 6 to 8 are schematic configurational views showing one of individual photoelectric conversion elements (unit pixels) arranged in a two-dimensional matrix, respectively corresponding to a schematic plan view thereof, a cross-sectional view taken along I—I line in FIG. 6, and a cross-sectional view taken along II—II line in FIG. 6. FIG. 9 is a circuit diagram showing the schematic configuration of the photoelectric conversion apparatus in this embodiment. FIG. 10 is a pulse timing chart for explaining an operation of the circuit diagram shown in FIG. 9.

As shown in FIGS. 1 to 8, each of the photoelectric conversion elements arranged in a two-dimensional matrix in the photoelectric conversion apparatus in accordance with this embodiment comprises a photodiode (photoelectric conversion portion; PD) 1 for generating and storing a charge corresponding to incident light; a junction field effect transistor (amplifying portion; referred to as "JFET" hereinafter) 2 for outputting a signal corresponding to the charge received by its gate region (control region); a transfer gate (transfer-purpose control means of a transfer control portion; TG) 3 for transferring the charge generated and stored by the photodiode 1 to the gate region of the JFET 2; a reset drain (reset-purpose charge draining means; RD) 4 for draining the charge transferred to the gate region of the JFET 2; and a reset gate (reset-purpose control means; RG) 5 for controlling the reset drain 4. In addition, transfer gate lines 3a, reset gate lines 5a, source lines 16a, reset drain lines 20, and drain shunt lines 100 are formed as depicted.

In this embodiment, as shown in FIGS. 1 to 8, the drain shunt lines 100 commonly connecting drain regions 17 of the JFETs 2 along the column direction are formed at a rate of 1 line to a plurality of columns. (While they can be formed at a rate of 1 line to 2 columns, a considerably higher yield in manufacture is obtained when formed at a rate of 1 line to 3 or more columns, and a much higher yield in manufacture is obtained when formed at a rate of 1 line to 10 or more columns, whereby they can be formed at a rate of 1 to 20 or more columns, for example.) In the columns where no drain shunt line 100 is formed, light-shielding dummy lines 200, which are made of an aluminum film or the like and are electrically floating without connecting with the drain regions 17 (without having drain contacts 101), are respectively continuously formed along the column direction. In this embodiment, the dummy line 200 is the same as the drain shunt line 100 in terms of pattern form and the like, while differing therefrom only in that it lacks drain contacts 101.

Here, an n-type silicon layer 11, which becomes a channel region 18, is formed by epitaxial growth on a p-type silicon substrate 10. Then, for example, boron ($B^+$) or phosphorus ($P^+$) is introduced into the n-type silicon layer 11 by an ion implantation or thermal diffusion method so as to form a p-type photodiode region 12, a p-type gate region 13, the reset drain 4, and so on. Further, the transfer gate 3 and the reset gate 5 are formed by a lithography technique or the like by way of an insulating layer (not depicted) so as to fabricate the photodiode 1 and JFET 2.

Here, an n-well region 14 of the photodiode 1 is formed in order to control the overflow potential of carriers generated in the pn junction to a predetermined level.

The transfer gate 3, the p-type photodiode region 12 of the photodiode 1, and the p-type gate region 13 of the JFET 2 constitute a p-channel MOS transistor (MOSFET; see FIGS. 6 and 8). Also, the reset gate 5, a p-type reset drain region 15 of the reset drain 4, and the p-type gate region 13 of the JFET 2 constitute a p-channel MOSFET (see FIGS. 6 and 7).

The photodiode 1 includes the p-type photodiode region 12, the n-type silicon layer 11 (including the n-well region 14), and the p-type silicon substrate 10, which are successively disposed from the silicon layer surface toward the p-type silicon substrate 10, thereby forming a so-called pnp-type vertical overflow drain structure. This structure can suppress bleeding phenomena such as blooming and smear which may occur due to carriers (holes in this embodiment) generated thereby.

The JFET 2 is constituted by an $n^+$-type source region 16, the $n^+$-type drain region 17, the p-type gate region 13, and an n-type channel region (n-channel) 18. They are arranged so as to form a pnp-type structure comprising the p-type gate region 13, the n-type channel region 18, and the p-type silicon substrate 10 which are successively disposed from the silicon layer surface toward the p-type silicon substrate 10. As a result, the p-region (p-type silicon substrate 10 in this embodiment) which is disposed under the n-type channel region 18 and inherently has a function of back gate is connected to a constant power supply. Here, the thickness (height) from the silicon layer surface to the surface of the p-type silicon substrate 10 is about 6 $\mu$m.

The $n^+$-type drain regions 17 are continuously formed like a mesh (grid) so as to commonly connect all the photoelectric conversion elements (pixels) on the substrate along the column direction (vertical direction in FIG. 1) and row direction (horizontal direction in FIG. 1). Also, the $n^+$-type drain regions 17 of the respective JFETs 2 in one column for a predetermined number of columns are commonly connected along the column direction through drain contacts 101 by the light-shielding drain shunt line 100 made of an aluminum film or the like. Further, the $n^+$-type source regions 16 of the respective JFETs 2 in each row are commonly connected along the row direction by the source line 16a made of an aluminum film or the like.

As a pulse voltage is applied to the reset gate 5, the reset gate 5 and the reset drain 4 initialize the control region of the JFET 2 (p-type gate 13 in this embodiment) to the potential of the reset drain 4.

Accordingly, unlike the conventional photoelectric conversion element, the JFET 2 does not operate (does not turn on) at the time of initialization operation. Therefore, even when a number of such elements are arranged so as to constitute a photoelectric conversion apparatus, for example, outputs of the respective photoelectric conversion elements are prevented from fluctuating due to the difference in amplification factors in the JFETs 2 which may occur when bias points (operating points) of transistors greatly change in response to a large current flowing therein. Also, the power consumption is reduced.

Also, as can be seen from FIGS. 1 to 8, the reset drains 4 are commonly connected along the row direction by reset drain lines 20 (aluminum (Al) films in this embodiment) which extend in the row direction and function as row-selecting lines. The reset drain line 20 also serves as a light-shielding film for protecting the parts other than the photodiode 1 from light. Here, the reset drain line 20 is connected to the reset drain 4 by way of a relay line 102 which is made of an aluminum film or the like. The reset drain line 20, which may be formed of metals other than aluminum, can be fabricated by a sputtering process for depositing a metal film.

Accordingly, the thickness (height) of the whole element can be made smaller than the element in which a dedicated light-shielding film is further disposed on the top, whereby the degree of integration and the aperture ratio for the photodiode 1 can be improved. Also, since the metal line (reset drain line 20) is disposed near the photodiode 1, bleeding phenomena such as blooming and smear due to oblique incident light can be suppressed.

Here, also with reference to FIG. 9, each pixel (photoelectric conversion element) 31 is constituted by the photodiode 1 for generating and storing a charge corresponding to incident light; the JFET 2 for generating a signal output corresponding to the charge received by its gate region; and a transfer control element (p-channel type MOSFET) 31a comprising the transfer gate 3 for transferring the charge generated and stored by the photodiode 1 to the gate region of the JFET 2; and a reset element (p-channel type MOSFET) 31b comprising the reset drain 4 which is the reset-purpose charge draining means for draining the charge transferred to the control region of the JFET 2 and the reset gate 5 which is the reset-purpose control means for controlling the reset drain 4.

The sources of the JFETs 2 in the same columns of the matrix arrangement are commonly connected to respective vertical source lines 32a, 32b, and 32c (corresponding to the source lines 16a in FIGS. 1 to 8). Also, the drains of JFETs 2 and the cathodes of photodiodes 1 of all the pixels are commonly connected to a drain power supply 31c by way of the $n^+$-type diffusion layers 17 and the drain shunt lines 100. Further, the anode of each photodiode 1 and the gate region of each JFET 2 are forming one or the other of the source and drain of the transfer control element 31a, and also, the gate region of each JFET 2 and the reset drain 4 are forming one or the other of source and drain of the reset element 31b.

The transfer gates (transfer gate electrodes) 3 of the transfer control elements 31a in the same rows in the matrix arrangement are commonly connected to respective clock lines 33a, 33b, and 33c (corresponding to the transfer gate line 3a in FIGS. 1 to 8) which are scanned by a vertical scanning circuit 34. The transfer control elements 31a successively operate row by row when respective drive pulses $\phi_{TG1}$ to $\phi_{TG3}$ sent from the vertical scanning circuit 34 are applied thereto.

The reset elements 31b are provided for the respective pixels 31. The reset drains 4 in each row are disposed in parallel to each other, while being commonly connected to their corresponding clock line 50a, 50b, or 50c (corresponding to the reset drain line 20 in FIGS. 1 to 8) which is scanned by the vertical scanning circuit 34. Also, the reset gates (reset gate electrodes) 5 of all the pixels are commonly connected to a drive pulse generating circuit 37 by way of reset gate lines (corresponding to the reset gate line 5a in FIGS. 1 to 8) extending along the row direction and a line 37a commonly connecting all the reset gate lines. The reset element 31b operates when the drive pulse $\phi_{RG}$ sent from the drive pulse generating circuit 37 is applied to the reset gate (reset gate electrode) 5.

The vertical source lines 32a, 32b, and 32c in the respective columns are connected to one terminals of capacitors for storing light signal output (second memory elements) $C_{S1}$, $C_{S2}$, and $C_{S3}$ by way of MOS transistors for transferring light signal output $T_{S1}$, $T_{S2}$, and $T_{S3}$ and to one terminals of capacitors for storing dark output (first memory elements) $C_{D1}$, $C_{D2}$, and $C_{D3}$ by way of MOS transistors for transferring dark output $T_{D1}$, $T_{D2}$, and $T_{D3}$; while being connected to a signal output line 38 and a dark output line 39 by way of their corresponding MOS transistors for selecting horizontal readout $T_{HS1}$, $T_{HS2}$, $T_{HS3}$, $T_{HD1}$, $T_{HD2}$, and $T_{HD3}$. The other terminals of the capacitors $C_{S1}$, $C_{S2}$, $C_{S3}$, $C_{D1}$, $C_{D2}$, and $C_{D3}$ are grounded (set to GND). In general, parasitic capacitances $C_{HS}$ and $C_{HD}$ respectively exist in the signal output line 38 and the dark output line 39. Also, buffer amplifiers 38a and 39a are respectively connected to the signal output line 38 and the dark output line 39.

On the other hand, the signal output line 38 and the dark output line 39 are respectively connected to MOS transistors $T_{RHS}$ and $T_{RHD}$ for resetting signal output line 38 and dark output line 39. Also, the other terminals of the MOS transistors $T_{RHS}$ and $T_{RHD}$ are grounded (set to GND). The MOS transistors $T_{RHS}$ and $T_{RHD}$ operate when a drive pulse $\phi_{RH}$ sent from a drive pulse generating circuit 43 is applied to their gate electrodes.

The gate electrodes of the MOS transistors for selecting horizontal readout $T_{HS1}$, $T_{HS2}$, $T_{HS3}$, $T_{HD1}$, $T_{HD2}$, and $T_{HD3}$ in the same columns are commonly connected to respective horizontal signal lines 40a, 40b, and 40c which are connected to a horizontal scanning circuit 40, whereby horizontal readout operations are controlled by drive pulses $\phi_{H1}$ to $\phi_{H3}$ sent from the horizontal scanning circuit 40.

The gate electrodes of the MOS transistors for transferring light signal output $T_{S1}$, $T_{S2}$, and $T_{S3}$ and the gate electrodes of the MOS transistors for transferring dark output $T_{D1}$, $T_{D2}$, and $T_{D3}$ are respectively connected to drive pulse generating circuits 41 and 42 by way of a clock line for light signal 41a and a clock line for dark output 42a. The MOS transistors for transferring light signal output $T_{S1}$, $T_{S2}$, and $T_{S3}$ and the MOS transistors for transferring dark output $T_{D1}$, $T_{D2}$, and $T_{D3}$ alternately operate in a predetermined order when their corresponding drive pulses $\phi_{TS}$ and $\phi_{TD}$ sent from the drive pulse generating circuit 41 and 42 are applied thereto.

On the other hand, the vertical source lines 32a, 32b, and 32c in the respective columns are connected to the reset transistors $T_{RV1}$, $T_{RV2}$, and $T_{RV3}$ and constant current sources 44a, 44b, and 44c for source-follower readout operation. Also, a power-supply voltage $V_{RV}$ is supplied to the reset transistors $T_{RV1}$, $T_{RV2}$, and $T_{RV3}$, whereas a power-source voltage $V_{CS}$ is supplied to the constant current sources 44a, 44b, and 44c for source-follower readout operation.

Here, a reset pulse $\phi_{RV}$ is supplied to the gate electrodes of the reset transistors $T_{RV1}$, $T_{RV2}$, and $T_{RV3}$ such that, when the reset pulse $\phi_{RV}$ becomes a high level, the reset transistors $T_{RV1}$, $T_{RV2}$, and $T_{RV3}$ are turned on, whereby the vertical source lines 32a, 32b, and 32c are grounded (in cases where $V_{RV}$=GND).

Also, the constant current sources 44a, 44b, and 44c for source-follower readout operation control the time constant for source-follower operations, while suppressing variations in the time constant due to fluctuations in bias points or the like of the respective pixels 31, thereby equalizing the gains so as to suppress the fixed pattern noise (referred to as "FPN" hereinafter).

In the following, the operation of the photoelectric conversion apparatus in accordance with this embodiment will be explained with reference to the pulse timing chart shown in FIG. 10. In FIG. 10, the duration from $t_{11}$ to $t_{15}$ represents the readout operation of pixels 31 in the first row, and durations from $t_{21}$ to $t_{25}$ and from $t_{31}$ to $t_{35}$ thereafter respectively correspond to the second and third rows. Also, $t_{11}$ to $t_{14}$ respectively correspond to periods for row selection and initialization operation of the JFETs 2, the source-follower operation of the JFETs 2 in the first row after the initialization, the transfer operation of signal charges from the photodiodes 1 to the JFETs 2, and the source-follower operation of the JFETs 2 after the transfer. These four operations are performed in a horizontal blanking period. Also, $t_{15}$ is the image signal output period.

First, at the start of period $t_{11}$, the drive pulse $\phi_{RD1}$ is set to a high level (while each of the drive pulses $\phi_{RD2}$ and $\phi_{RD3}$ is kept at a low level), the voltage drive pulse is applied to the reset drains 4 of the pixels 31 in the first row. Then, by way of the reset gates 5 of all the pixels 31 which have already been set to a conductive (on) state at the low level, the high-level voltage is transmitted to the gate regions of the JFETs 2 of the pixels 31 in the first row, whereas the low-level voltage is transmitted to the gate regions of the JFETs 2 of the pixels 31 in the second and third rows. Consequently, the gate regions of these JETs 2 are initialized (charges are drained therefrom), and the JFETs 2 in the first row are selected (turned on), while the JFETs 2 in the second and later rows are not selected (turned off).

Namely, depending on the rows in which voltage drive pulses ($\phi_{RD1}$, $\phi_{RD2}$, and $\phi_{RD3}$) are sent to the reset drains 4, the JFETs 2 are selected (turned on) or not selected (turned off), while the gate regions of the JFETs 2 in the selected and non-selected rows are respectively initialized to high-level and low-level potentials.

At the end of period $t_{11}$ (or start of period $t_{12}$), the drive pulse $\phi_{RG}$ is set to the high level, so as to place the reset gates 5 into the non-conductive (off) state, whereby the control region of each JFET 2 is set to a floating state while maintaining its selected (on) or non-selected (off) state.

At the same time (at the start of period $t_{12}$), the drive pulse $\phi_{RV}$ is set to the low level so as to place the reset transistors $T_{RV1}$ to $T_{RV3}$ into the interrupted (off) state. During this period $t_{12}$, each JFET 2 in the first row performs the source-follower operation. Here, during this period $t_{12}$, the drive pulse $\phi_{TD}$ is at the high level so as to keep the MOS transistors for transferring dark output $T_{D1}$, $T_{D2}$, and $T_{D3}$ in the conductive (on) state, whereby the output (output at dark) voltages corresponding to the potentials immediately after the initialization of the gate regions of the JFETs 2 are respectively stored in the capacitors for storing dark output $C_{D1}$, $C_{D2}$, and $C_{D3}$.

In the period $t_{13}$, the drive pulse $\phi_{TG1}$ is set to the low level so as to shift the transfer gates 3 from the non-conductive (off) state to the conductive (on) state, while the drive pulses $\phi_{TS}$ and $\phi_{TD}$ are respectively set to the high and low level so as to place the MOS transistors for transferring light signal output $T_{S1}$, $T_{S2}$, and $T_{S3}$ into the conductive (on) state and the MOS transistors for transferring dark output $T_{D1}$, $T_{D2}$, and $T_{D3}$ into the non-conductive (off) state.

As a result, signal charges generated and stored in the photodiodes 1 in the first row are transferred to the gate regions of the JFETs 2. Here, the potential of the gate region of each JFET 2 after the charge transfer changes (increases in this case) by the value of signal charge amount/gate capacitance. In FIG. 10, the reason why the transfer gates 3 and reset gates 5 become the conductive (on) state when the drive pulses $\phi_{TG1}$ to $\phi_{TG3}$ and $\phi_{RG}$ are at the low level is that, since the transfer control element 31a and the reset element 31b are of a p-channel type, its polarity becomes opposite to that of the other drive pulses.

In the period $t_{14}$, as with the period $t_{12}$, the drive pulse $\phi_{TG1}$ is set to the high level so as to place the transfer gates 3 in the first row into the non-conductive (off) state, thereby causing the signal charges photoelectrically converted by the photodiodes 1 to be stored; while the drive pulse $\phi_{RV}$ is set to the low level so as to place the reset transistors $T_{RV1}$ to $T_{RV3}$ into the interrupting (off) state, thereby causing each JFET 2 in the first row to perform the source-follower operation.

Here, during the period $t_{14}$, since the drive pulse $\phi_{TS}$ is at the high level, the MOS transistors for transferring light signal output $T_{S1}$, $T_{S2}$, and $T_{S3}$ are in the conductive (on) state, whereby the output (signal output) voltages corresponding to the potentials immediately after the signal charges are transferred to the gate regions of the JFETs 2 are respectively stored in the capacitors for storing light signal output $C_{S1}$, $C_{S2}$, and $C_{S3}$.

In the period $t_{15}$, each of the drive pulses $\phi_{RD1}$, $\phi_{RG}$, and $\phi_{TS}$ is set to the low level, while the drive pulse $\phi_{RV}$ is set to the high level, so that the output voltages (image signals) stored in the capacitors for storing light signal output $C_{S1}$ to $C_{S3}$ and capacitors for storing dark output $C_{D1}$ to $C_{D3}$ are ready to be fed to their corresponding output terminals $V_{OS}$ and $V_{OD}$.

Then, the drive pulses $\phi_{H1}$ to $\phi_{H3}$ from the horizontal scanning circuit 40 and the drive pulse $\phi_{RH}$ from the drive pulse generating circuit 43 are sequentially transmitted, whereby the image signals stored in the capacitors for storing light signal output $C_{S1}$ to $C_{S3}$ and capacitors for storing dark output $C_{D1}$ to $C_{D3}$ are read out into the horizontal signal lines of the signal output line 38 and dark output line 39, respectively, outputting the image signals from the output terminals $V_{OS}$ and $V_{OD}$, and then the signal output line 38 and dark output line 39 are reset.

Here, the image signals obtained from the output terminals $V_{OS}$ and $V_{OD}$ are subjected to arithmetic processing by an external arithmetic circuit not depicted. Namely, since the image signal obtained from the output terminal $V_{OS}$ contains a signal charge component (S) and a dark component (D), while the image signal obtained from the output terminal $V_{OD}$ contains only the dark component (D), the image signals obtained from the output terminals $V_{OS}$ and $V_{OD}$ is subjected to the arithmetic processing (subtraction ($V_{OS}-V_{OD}$)) in order to extract only the image signal corresponding to the signal charge component (S).

The readout operation for the first row in the foregoing periods $t_{11}$ to $t_{15}$ is similarly repeated for the second and third rows in the periods $t_{21}$ to $t_{25}$ and the periods $t_{31}$ to $t_{35}$, respectively. Here, in the photoelectric conversion apparatus in accordance with this embodiment, since the reset elements 31a are provided for the respective pixels 31, while the reset drains 4 are disposed in parallel to each other in each row, the reset operation becomes very fast. Accordingly, the total time of the periods $t_{11}$ to $t_{15}$, $t_{21}$ to $t_{25}$, and $t_{31}$ to $t_{35}$ can be made shorter than that in the conventional photoelectric conversion apparatus.

In this embodiment, the drain shunt lines 100 are formed at a rate of 1 line to a plurality of columns, while the dummy lines 200 are formed in the remaining columns in place of the drain shunt lines 100. Each dummy line 200 is electrically floating, without being connected to the drain regions 17 of the JFETs 2 or the power supply 31c. Accordingly, even when electric connection is established between the dummy line 200 and the source line 16a or between the dummy line 200 and the relay line 102 due to the influence of particles or the like in the manufacturing process, no problems of short-circuiting between lines occur. Therefore, in this embodiment, as the drain shunt lines 100 are reduced as being substituted by the dummy lines 200, the high yield in manufacture is attained. Also, since the dummy line 200 is the same as the drain shunt line 100 in terms of pattern form, the aperture ratio of the pixels in the column where the dummy line 200 is formed does not differ from that of the pixels in the column where the drain shunt line 100 is formed. Accordingly, in this embodiment, the sensitivity can be prevented from fluctuating.

Embodiment 2

Figure 11:
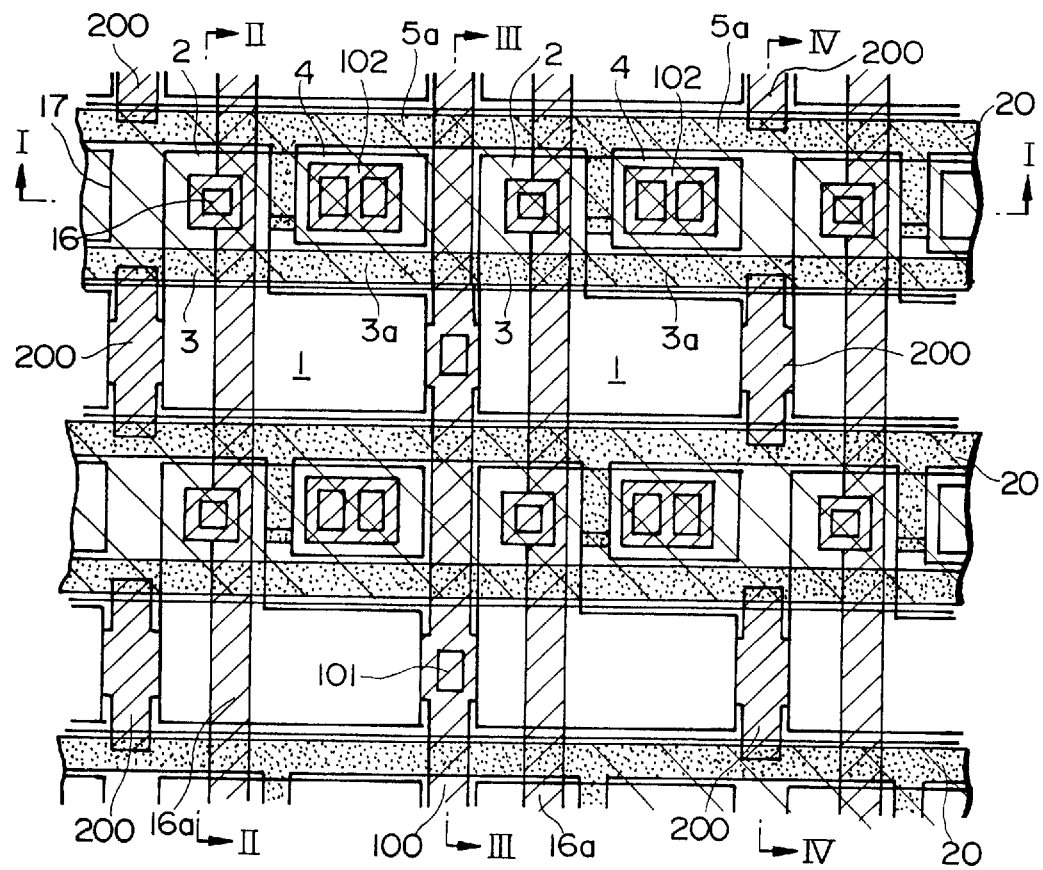
FIGS. 11 and 12 are schematic configurational views showing the photoelectric conversion apparatus in accordance with Embodiment 2 of the present invention.
Figure 12:
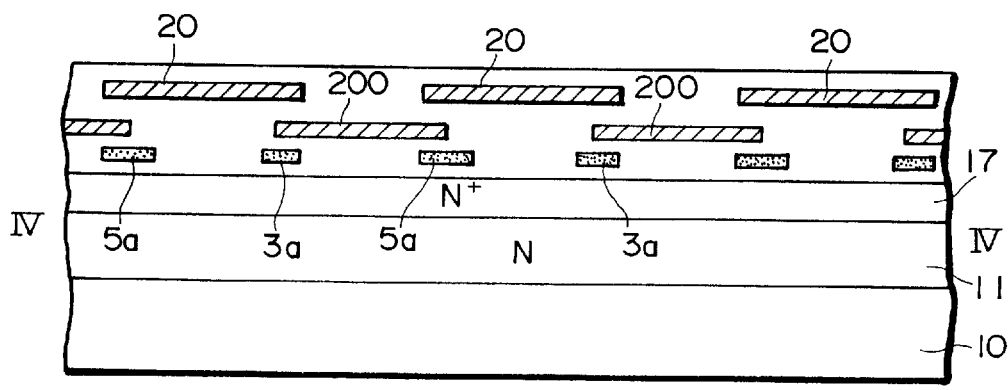

FIGS. 11 and 12 are schematic configurational views showing the photoelectric conversion apparatus in accordance with Embodiment 2 of the present invention, respectively corresponding to a schematic plan view thereof and a cross-sectional view taken along IV—IV line in FIG. 11.

The photoelectric conversion apparatus in accordance with this embodiment differs from that in accordance with Embodiment 1 only in that, while the dummy line 200 is continuously formed along the column direction in Embodiment 1, it is intermittently formed in the column direction so as to be missing at nearly the whole part of regions where it intersects with the reset drain line 20 which is a row-selecting line also serving as a light-shielding film and extends in the row direction. In this embodiment, the pattern form of the dummy line 200 is the same as that of the part of the drain shunt line 100 placed at the same position in the column direction. Also, each end portion of the dummy line 200 in the column direction slightly overlaps with the reset drain line 20.

Figure 2:
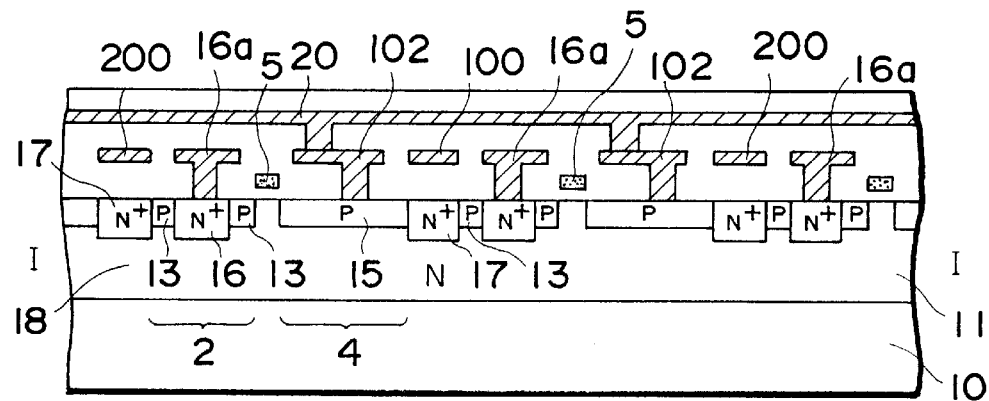
Figure 3:
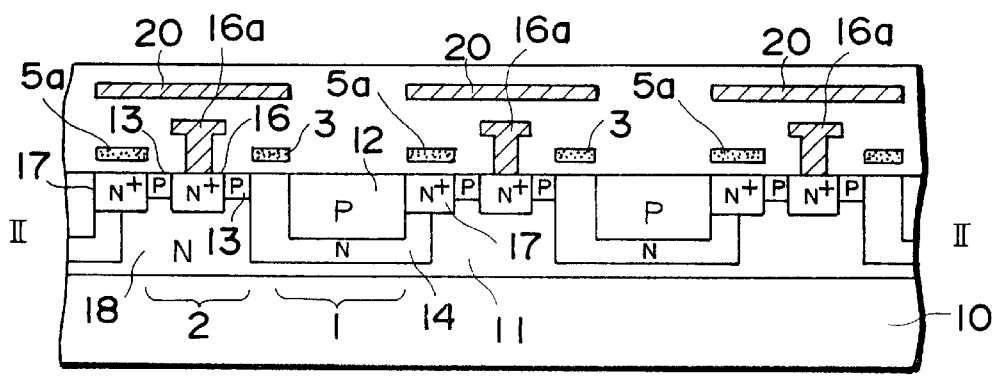
Figure 4:
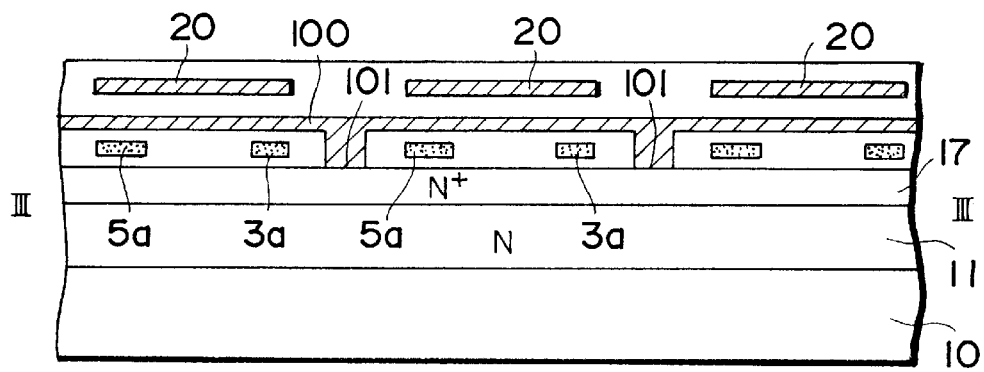

Here, when the dummy lines 200 on the left and right sides of FIG. 2 are omitted therefrom, it corresponds to the cross-sectional view taken along I—I line in FIG. 11. Also, the cross-sectional view taken along II—II line in FIG. 11 is the same as FIG. 3, whereas the cross-sectional view taken along III—III line in FIG. 11 is the same as FIG. 4.

In this embodiment, the dummy lines 200 are cut in the column direction by pixel pitches, whereby the length of the dummy lines 200 is remarkably reduced. Also, since the dummy lines 200 are missing at the intersection regions with respect to the light-shielding films 20 where wiring is most congested, the wiring space is broadened in these regions. Accordingly, the dummy line 200 and the source line 16a or the dummy line 200 and the junction line 102, for example, can connect with each other less frequently, thereby lowering the probability at which short-circuiting occurs between the source line 16a and the relay line 102 by way of one dummy line 200. Therefore, the very high yield is attained. Also, since the dummy lines 200 are cut with fine pitches, the parasitic capacitance of the dummy lines 200 is small. Accordingly, even when connected with the source line 16a or the relay line 102, they hardly affect the operating speed or the like. Here, since the dummy lines 200 are missing at the regions intersecting with the light-shielding film 20, i.e., regions which are not contributory to photosensitivity, the aperture ratio does not change, and the sensitivity does not fluctuate.

Embodiment 3

Figure 13:
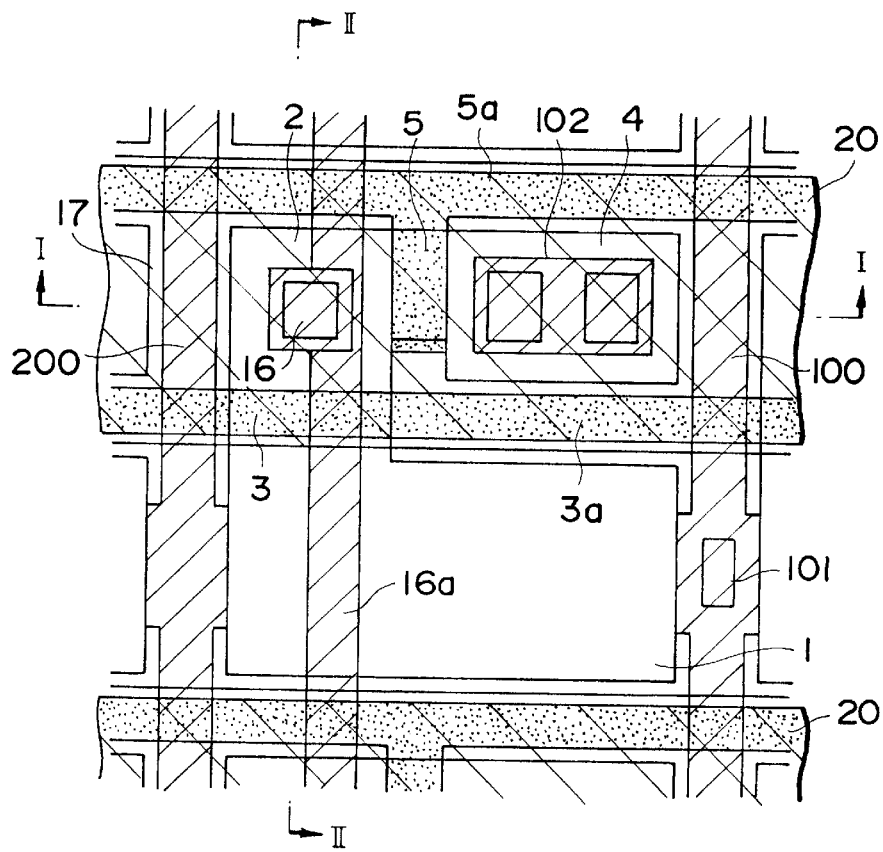
FIGS. 13 to 15 are schematic configurational views showing a unit pixel in the photoelectric conversion apparatus in accordance with Embodiment 3 of the present invention.
Figure 14:
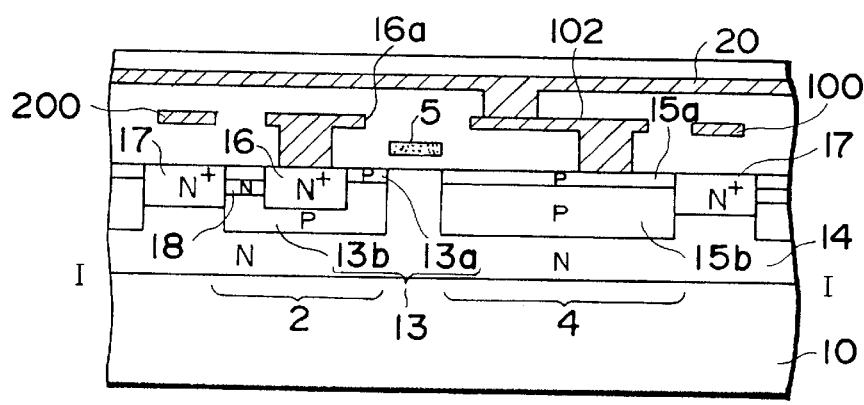
Figure 15:
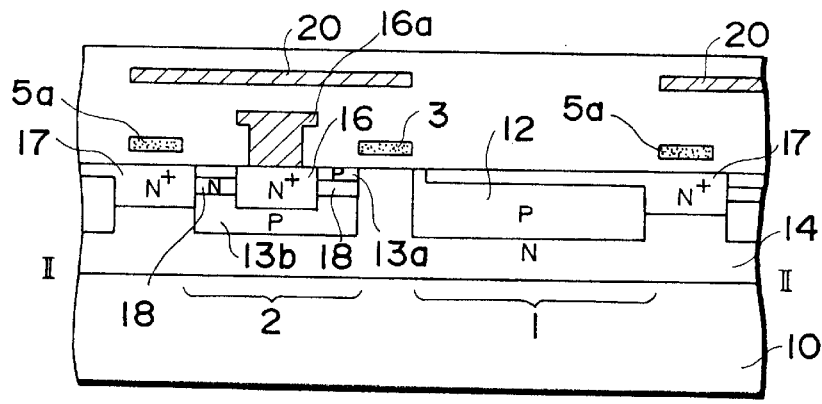

FIGS. 13 to 15 are schematic configurational views showing one of individual photoelectric conversion elements (unit pixels) arranged in a two-dimensional matrix in the photoelectric conversion apparatus in accordance with Embodiment 3 of the present invention, respectively corresponding to a schematic plan view thereof, a cross-sectional view taken along I—I line of FIG. 13, and a cross-sectional view taken along II—II line of FIG. 13.

The photoelectric conversion apparatus in accordance with this embodiment differs from that shown in FIGS. 6 to 8 only in the following points.

The first difference between the photoelectric conversion apparatus of this embodiment and that of Embodiment 1 lies in that the photodiode 1 and JFET 2 in the photoelectric conversion element in the former differ from those in the latter in terms of structure.

Namely, the photodiode 1 of the photoelectric conversion element in this embodiment forms a buried photodiode of an npnp type vertical overflow drain structure (in which a buried photodiode is constructed by the npn configuration, while the overflow drain structure is formed by the pnp configuration) from the silicon layer surface toward the p-type silicon substrate 10. This point distinguishes the photodiode 1 in the photoelectric conversion element in the photoelectric conversion apparatus of this embodiment from that in Embodiment 1.

Accordingly, bleeding phenomena such as blooming and smear can be suppressed by the overflow drain structure for draining the overflowing carriers, while the dark current is suppressed since the buried photodiode prevents the depletion layer generated at the pn junction portion from reaching the surface. Also, since no charge remains in the photodiode after the charge is transferred (the photodiode becomes completely depleted), ideal characteristics in which image lag and reset noise are suppressed can be obtained.

Further, this embodiment is different from Embodiment 1 in that the n-well region 14 which is formed only around the photodiode 1 in Embodiment 1 is formed over the whole surface on the p-type silicon substrate 10. In general, in order to keep a high internal quantum efficiency, the photodiode of a vertical overflow drain structure is desirably constructed in such a manner that the pn junction is formed as deep as possible from the silicon layer surface toward the p-type silicon substrate 10.

Accordingly, the n-well region 14 is formed deeper toward the p-type silicon substrate 10. Here, since the n-well region 14 diffuses (side-diffuses) in the lateral directions (in the directions perpendicular to the direction toward the p-type silicon substrate 10) as well, its design needs to take account of this side diffusion. In this embodiment, n-well region 14 is formed over the whole surface of the p-type silicon substrate 10, while the JFET 2 is formed in the n-well region 14, whereby the influence of the side diffusion of the n-well is eliminated so as to improve the degree of integration and aperture ratio.

First, the JFET 2 of the photoelectric conversion element in this embodiment structurally differs from that in the photoelectric conversion apparatus in Embodiment 1 in that it is shallowed (in a shallow junction arrangement) as a whole (particularly in its channel portion). When the JFET 2 which effects only the amplification operation is shallowed, the size of the JFET 2 as a whole is reduced by the shallowed part, whereby the degree of integration and aperture ratio can be improved.

In addition, improvement in a characteristic of the amplifying portion, i.e., transconductance (gm), and amelioration of a saturation characteristic (reduction in drain voltage dependance of its saturation region) can be attained. An improvement in transconductance (gm), which is of course important, for example, when the JFET 2 is used for amplifying current, can lower the time constant (or increase the speed) or enhance the sensitivity at the time of source-follower operation as well.

Second, in the JFET 2 of the photoelectric conversion element in this embodiment, the p-type gate region 13 (comprising the first conductivity type shallow gate region 13a and the first conductivity type gate region 13b; see FIG. 14) is formed on and under the channel (n-channel) region 18, while the first conductivity type shallow gate region 13a and the first conductivity type gate region 13b are electrically connected to each other in a portion where no channel is formed. Further, it differs from the JFET 2 in Embodiment 1 in that the p-type gate region 13 and the p-type silicon substrate 10 are electrically separated from each other by the n-well region 14. As a result, the influence of the substrate voltage (substrate bias effect) upon characteristics of the photoelectric conversion element itself can be remarkably reduced.

Further, for example, when the JFET 2 is caused to perform a source-follower operation in thus constructed photoelectric conversion apparatus, the reduction in drain voltage dependance and reduction in substrate bias effect mentioned above can be greatly effective in improving the sensitivity of each pixel disposed in the photoelectric conversion apparatus and suppressing fluctuations in the sensitivity (e.g., fixed pattern noise).

Thus, the JFET 2 of the photoelectric conversion element in this embodiment yields improved degree of integration and aperture ratio, higher sensitivity, and suppressed fluctuation in sensitivity as compared with the photoelectric conversion element in the photoelectric conversion apparatus in Embodiment 1.

Also, in this embodiment, as with Embodiment 1, the drain shunt lines 100 commonly connecting the drain regions of the JFETs 2 along the column direction are formed at a rate of 1 line to a plurality of columns. The electrically floating light-shielding dummy lines 200 made of an aluminum film or the like, each of which is not connected to the drain regions 17 (i.e., has no drain contact), are continuously formed along the column direction in the remaining columns in place of the shunt lines 100. Accordingly, in this embodiment, as with Embodiment 1, the high yield in manufacture is attained, while the sensitivity is prevented from fluctuating. Here, the dummy lines 200 may be formed intermittently in the column direction as in the case of Embodiment 2.

Embodiment 4

Figure 16:
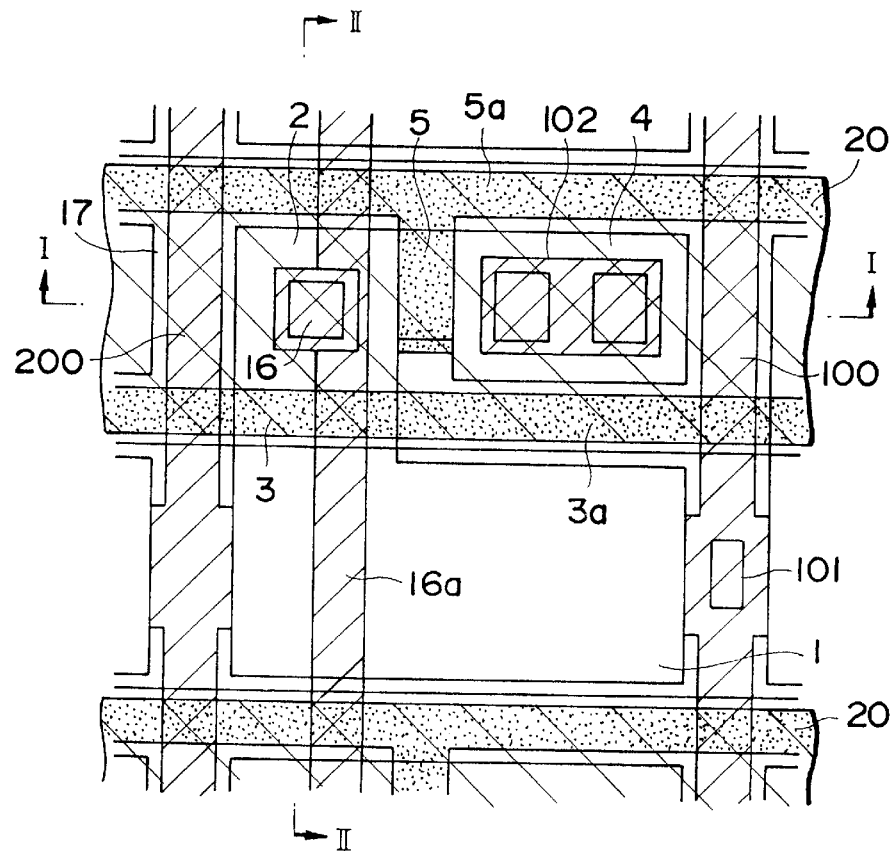
FIGS. 16 to 18 are schematic configurational views showing a unit pixel in the photoelectric conversion apparatus in accordance with Embodiment 4 of the present invention.
Figure 17:
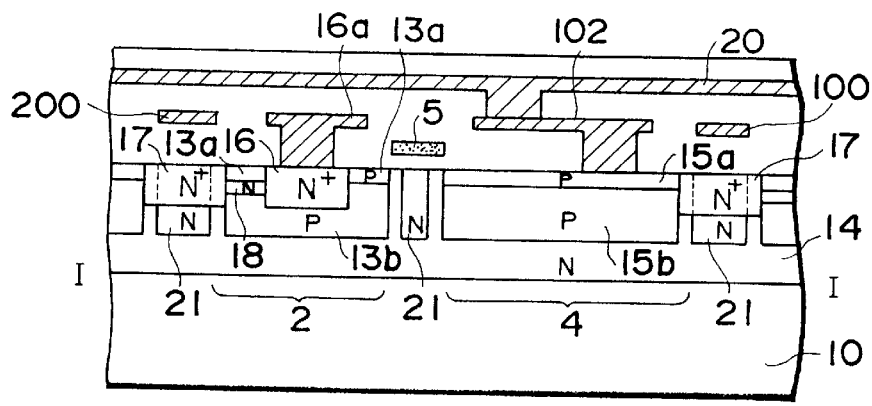
Figure 18:
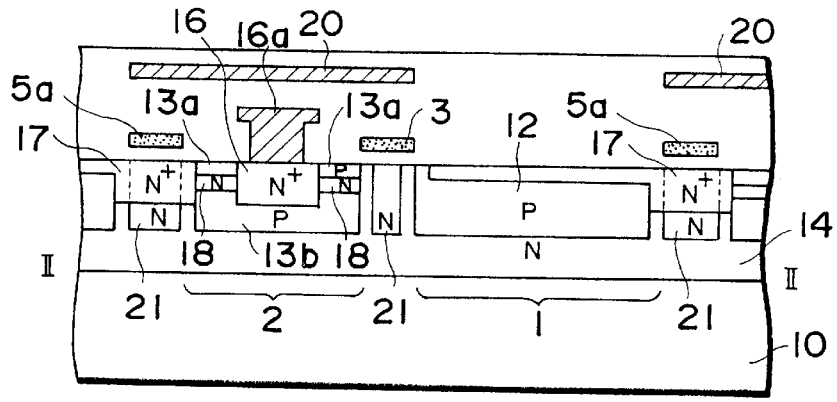

FIGS. 16 to 18 are schematic configurational views showing one of individual photoelectric conversion elements (unit pixels) arranged in a two-dimensional matrix in the photoelectric conversion apparatus in accordance with Embodiment 4 of the present invention, respectively corresponding to a schematic plan view thereof, a cross-sectional view taken along I—I line of FIG. 16, and a cross-sectional view taken along II—II line of FIG. 16.

The photoelectric conversion apparatus in accordance with this embodiment differs from that of Embodiment 3 only in the following point.

Namely, the photoelectric conversion element in this embodiment differs from that in the photoelectric conversion apparatus of Embodiment 3 in that an element isolation region 21 of a predetermined conductivity type (n-type in this embodiment) is formed in the peripheral regions of the photodiode 1, JFET 2, and reset drain 4 (including the regions where the transfer gate 3 and the reset gate 5 are formed).

Normally, since the respective p-type regions of the photodiode 1, JFET 2, and reset drain 4 are formed in the n-well region 14, they are electrically isolated from each other by the n-well region 14. In general, the width of isolation effected by the n-well region 14 is desirably as small as possible from the viewpoint of improvement in degree of integration and aperture ratio.

Nevertheless, the respective p-type regions of the photodiode 1, JFET 2, and reset drain 4 cannot be formed too shallow (from the silicon surface toward the substrate) in view of the performance of the photoelectric conversion element. In particular, on the contrary, the photodiode 1 is desirably formed as deep as possible from the silicon surface toward the substrate from the viewpoint of quantum efficiency. It is thus the case that the spread (side diffusion) in the lateral directions (directions perpendicular to the direction toward the substrate) increases, making it difficult to reduce the width of isolation.

Thus, in this embodiment, the n-type element isolation region 21 is formed so as to suppress the side diffusion of the p-type regions and reduce the isolation width. Accordingly, while the degree of integration in the photoelectric conversion element as a whole and the aperture ratio of the photodiode 1 can be improved, the threshold voltage control can be facilitated in the transfer gate 3 and reset gate 5.

Also, in this embodiment, as with Embodiment 1, the drain shunt lines 100 commonly connecting the drain regions of the JFETs 2 along the column direction are formed at a rate of 1 line to a plurality of columns; while the electrically floating light-shielding dummy lines 200 made of an aluminum film or the like, each of which is not connected to the drain regions 17 (i.e., has no drain contact), are continuously formed along the column direction in the columns where no shunt lines 100 are formed. Accordingly, in this embodiment, as with Embodiment 1, the high yield in manufacture is attained, while the sensitivity is prevented from fluctuating. Here, the dummy lines 200 may be formed intermittently in the column direction as in the case of Embodiment 2.

Embodiment 5

Figure 19:
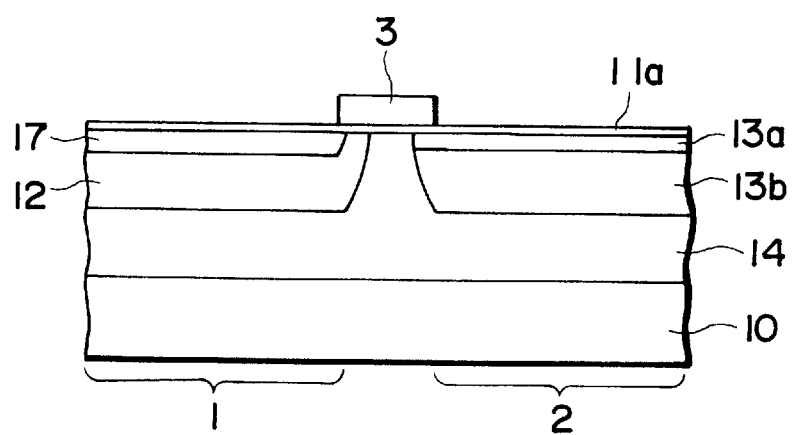
FIG. 19 is a schematic cross-sectional views showing an essential part of a unit pixel in the photoelectric conversion apparatus in accordance with Embodiment 5 of the present invention.

FIG. 19 is a cross-sectional view showing an essential part of one of individual photoelectric conversion elements (unit pixels) arranged in a two-dimensional matrix in the photoelectric conversion apparatus in accordance with Embodiment 5. This drawing shows the portion corresponding to a part of FIG. 15 or 18.

As shown in FIG. 19, the photodiode 1 in this embodiment is a buried photodiode (BPD) of a vertical overflow structure. Accordingly, it is necessary for the p-type diffusion layer 12 used herein to satisfy conditions (1) and (2) listed in the following. Here, an $SiO_2$ film 11a is formed on the silicon layer surface.

(1) The excessive photogenerated charge should overflow into the substrate.

(2) The photogenerated charge should completely be transferred to the JFET 2, so that the p-type diffusion of the BPD 1 is completely depleted.

On the other hand, it is necessary for the p-type diffusion used in the JFET 2 to satisfy the following conditions (1) to (3).

(1) The charge transferred from the BPD 1 should not overflow into the substrate.

(2) Punch-through should not occur between the source $n^+$-diffusion of the JFET 2 and the n-well region 14.

(3) The p-type diffusion region should not be depleted under the bias conditions where it operates as the JFET 2.

In order to concurrently satisfy these conditions, optimization is facilitated when the concentrations of the p-type diffusion regions in the BPD 1 and JFET 2 are set to values different from each other.

Accordingly, in the photoelectric conversion element in this embodiment, the impurity concentration of the charge storing portion 12, which is the p-type diffusion region of the BPD 1, is within the range of $5\times10^{15}$ cm$^{-3}$ to $3\times10^{16}$ cm$^{-3}$, and the impurity concentration of the first conductivity type gate region 13b, which is the p-type diffusion region of the JFET 2, is within the range of $6\times10^{15}$ cm$^{-3}$ to $3\times10^{16}$ cm$^{-3}$; while they are set to values different from each other. Here, these impurity concentrations can be adjusted when the implantation conditions, e.g., amount of implantation dose and diffusion time, for such ions as boron and phosphorus are changed.

In the other points, Embodiment 5 is similar to Embodiment 3 or 4.

Embodiment 6

Figure 20:
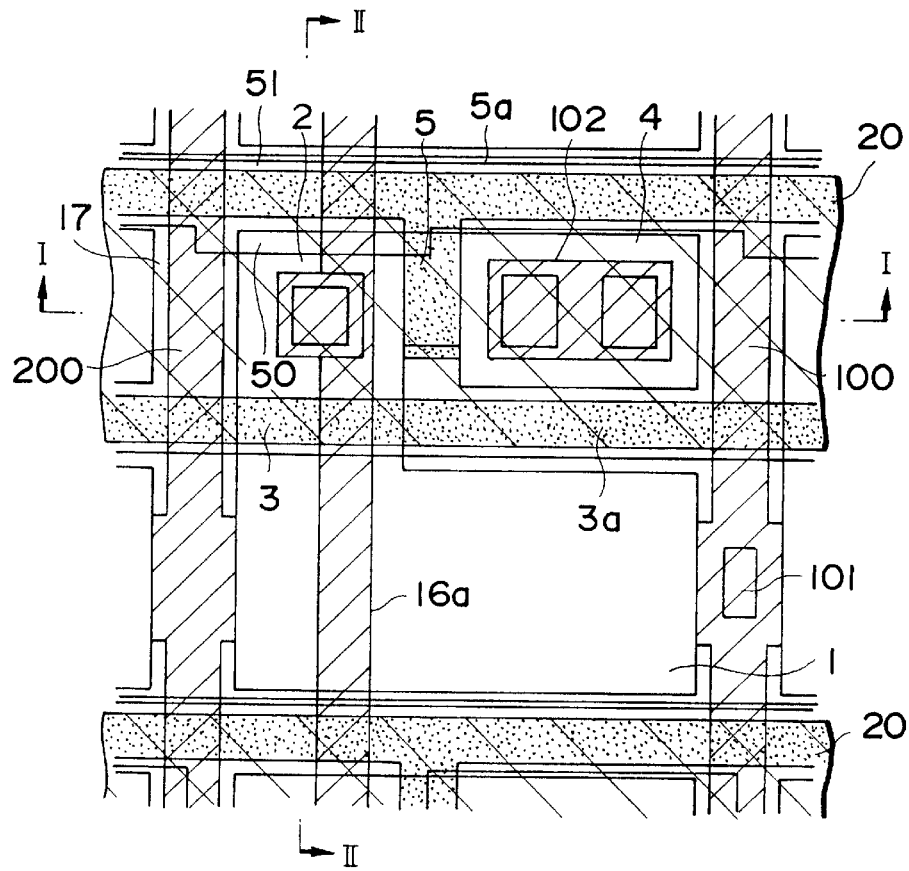
FIGS. 20 to 22 are schematic configurational views showing a unit pixel in the photoelectric conversion apparatus in accordance with Embodiment 6 of the present invention.
Figure 21:
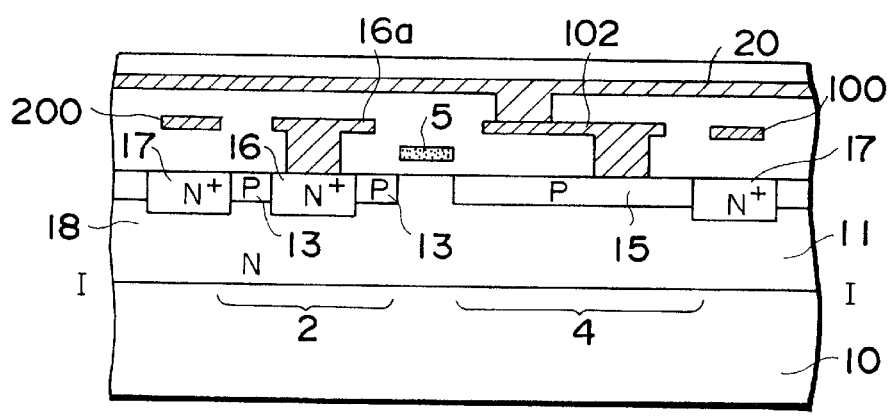
Figure 22:
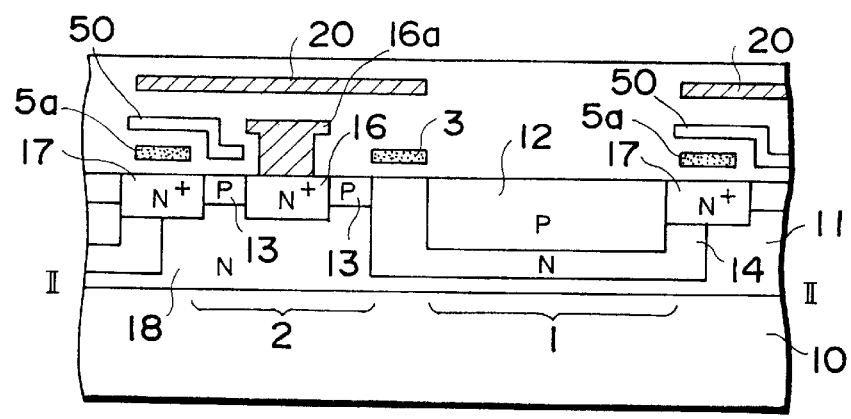
Figure 23:
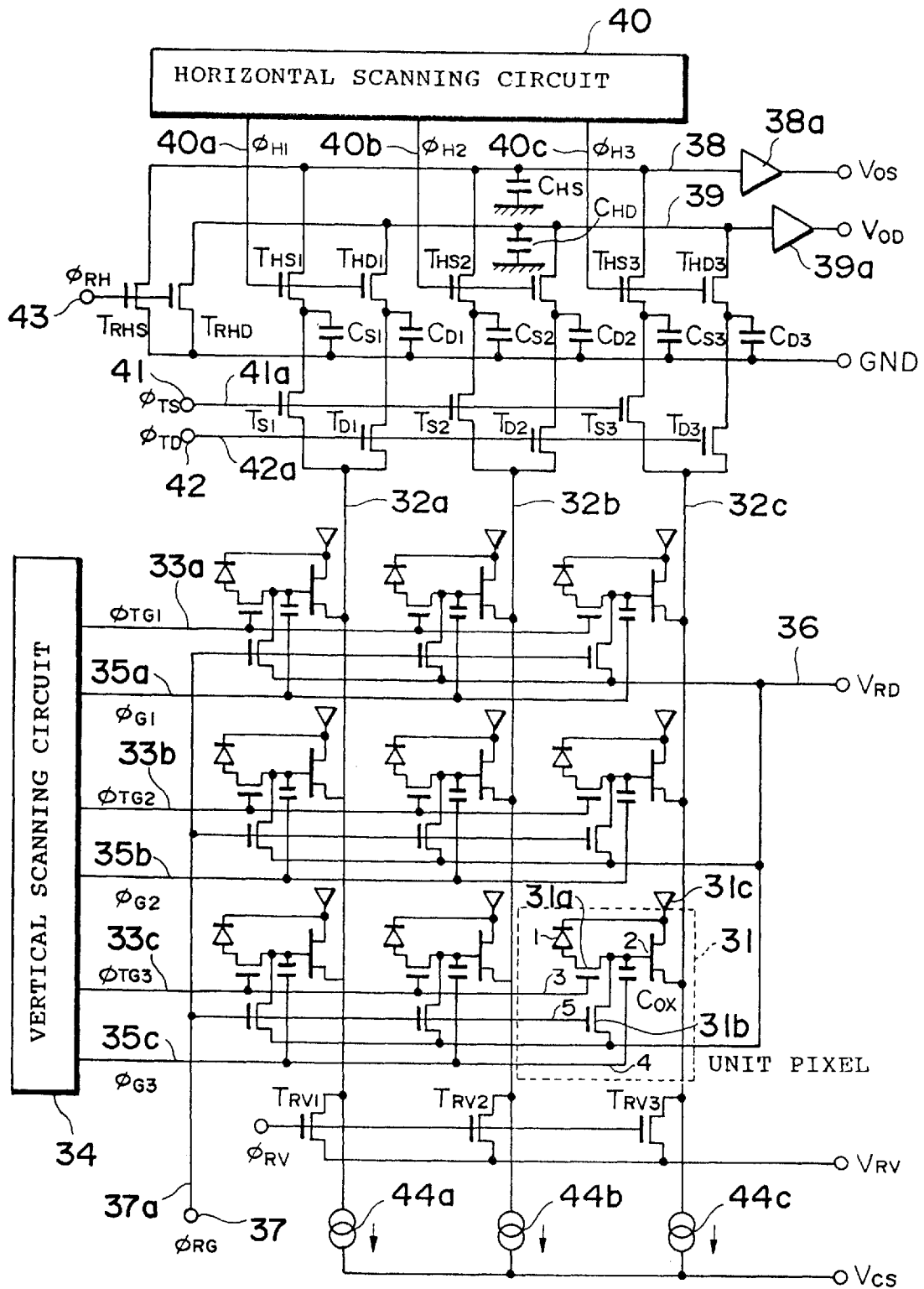
FIG. 23 is a circuit diagram showing the schematic configuration of the photoelectric conversion apparatus in accordance with Embodiment 6 of the present invention.
Figure 24:
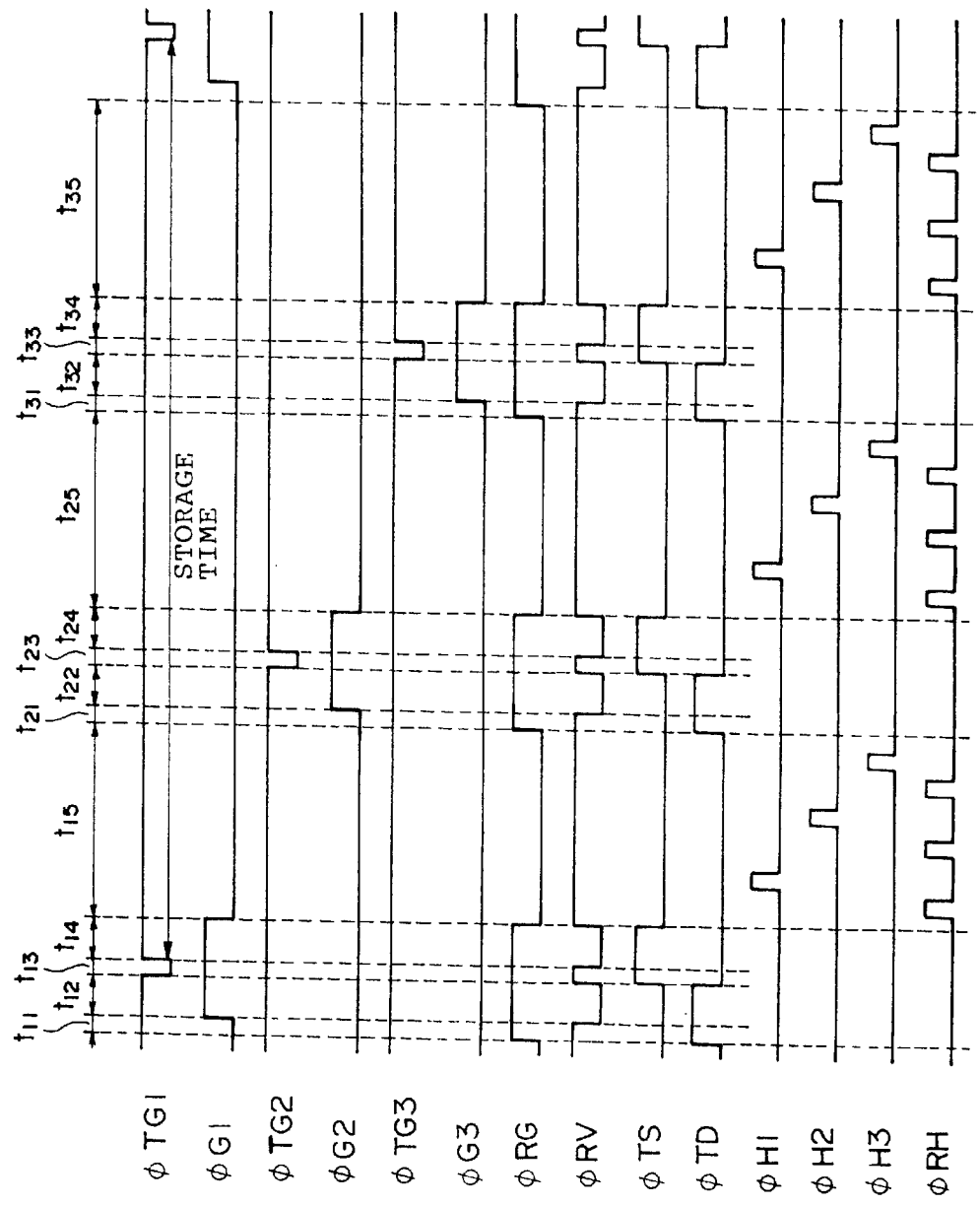
FIG. 24 is a pulse timing chart for explaining the operation of the circuit diagram shown in FIG. 23.

FIGS. 20 to 22 are schematic configurational views showing one of individual photoelectric conversion elements (unit pixels) arranged in a two-dimensional matrix in the photoelectric conversion apparatus in accordance with Embodiment 6 of the present invention, respectively corresponding to a schematic plan view thereof, a cross-sectional view taken along I—I line of FIG. 20, and a cross-sectional view taken along II—II line of FIG. 20. FIG. 23 is a circuit diagram showing the schematic configuration of the photoelectric conversion apparatus in accordance with this embodiment. FIG. 24 is a pulse timing chart for explaining the operation of the circuit diagram shown in FIG. 23.

The photoelectric conversion apparatus in accordance with this embodiment differs from that of Embodiment 1 only in the following point.

Namely, the photoelectric conversion element of the photoelectric conversion apparatus shown in FIGS. 20 to 22 is different from that shown in FIGS. 6 to 8 mostly in that a gate electrode 50 for controlling the gate region of the JFET 2 (amplifying portion) by capacitive coupling is formed in the JFET 2. In the other part of the structure, this photoelectric conversion element is identical to that shown in FIGS. 1 to 5.

Normally, in the JFET 2, the gate electrode 50 for controlling its gate region by capacitive coupling is formed. In the photoelectric conversion element shown in FIGS. 6 to 8, however, the gate electrode 50 is not formed. The differences due to this fact will be explained later.

Here, except that the gate electrode 50 is formed, the photoelectric conversion element shown in FIGS. 20 to 22 is the same as that shown in FIGS. 6 to 8. Accordingly, when the structures of the photodiode 1 and JFET 2 in the photoelectric conversion element shown in FIGS. 20 to 22 are assumed to be identical to those in FIGS. 13 to 15, the photoelectric conversion element becomes the same as that shown in FIGS. 13 to 15 except that the gate electrode 50 is formed therein. Also, when the element isolation region 21 of a predetermined conductivity type is formed between the mutual regions of the photodiode 1, JFET 2, reset drain 4 in the photoelectric conversion element shown in FIGS. 20 to 22, the photoelectric conversion element becomes the same as that shown in FIGS. 16 to 18 except that the gate electrode 50 is formed therein. Accordingly, their common portions will not be explained here.

In the photoelectric conversion apparatus of this embodiment, the photoelectric conversion elements shown in FIGS. 20 to 22 are arranged in a two-dimensional matrix. When FIG. 23, which is a circuit diagram showing its schematic configuration, is compared with FIG. 9, the gate electrodes 50 of the JFETs 2 constituting the pixels (photoelectric conversion elements) 31 in the photoelectric conversion apparatus shown in FIG. 23 are found to be commonly connected row by row to the vertical scanning circuit 34. Thus, the gate electrodes 50 are pulse-driven.

Namely, in the photoelectric conversion apparatus explained with reference to FIG. 9, since the gate electrode 50 is not formed in the JFET 2, the reset drain 4 is pulse-driven in place of the gate electrode 50. Since the gate electrode 50 is not formed in this photoelectric conversion apparatus, no wiring to the gate electrode 50 is necessary. Accordingly, it is advantageous in that, as the gate electrode 50 is not formed, the capacitance of the gate region in the JFET 2 can be made smaller, and the sensitivity can be enhanced.

By contrast, the photoelectric conversion apparatus shown in FIG. 23 is advantageous in that, since the gate electrode 50 is formed in the JFET 2, it is unnecessary for the reset drain 4 to be pulse-driven.

In the photoelectric conversion apparatus shown in FIG. 23, each pixel (photoelectric conversion element) 31 is constituted by the photodiode 1 for generating and storing a charge corresponding to incident light; the gate electrode 50 for controlling the gate region by means of capacitive coupling; the JFET 2 for generating a signal output corresponding to the charge received by its gate region; and the transfer control element (p-channel type MOSFET) 31a comprising the transfer gate 3 for transferring the charge generated and stored by the photodiode 1 to the gate region of the JFET 2; and the reset element (p-channel type MOSFET) 31b comprising the reset drain 4 for draining the charge transferred to the gate region of the JFET 2 and the reset gate 5 for controlling the reset drain 4.

The sources of the JFETs 2 in the same columns of the matrix arrangement are commonly connected to the respective vertical source lines 32a, 32b, and 32c. Also, the drains of JFETs 2 and the cathodes of photodiodes 1 of all the pixels are commonly connected to the drain power supply 31c by way of the $n^+$-diffusion layer 17 and the drain shunt line 100. Further, the anode of each photodiode 1 and the gate region of each JFET 2 are forming one or the other of the source and drain of the transfer control element 31a, and also, the gate region of each JFET 2 and the reset drain 4 are forming one or the other of the source and drain of the reset element 31b.

The transfer gates (transfer gate electrodes) 3 of the transfer control elements 31a in the same rows in the matrix arrangement are commonly connected to the respective clock lines 33a, 33b, and 33c which are scanned by the vertical scanning circuit 34. The transfer control elements 31a successively operate row by row when the respective drive pulses $\phi_{TG1}$ to $\phi_{TG3}$ sent from the vertical scanning circuit 34 are applied thereto.

The gate electrodes 50 provided for the JFETs 2 in the same rows in the matrix arrangement are commonly connected to respective clock lines 35a, 35b, and 35c which are scanned by the vertical scanning circuit 34. The JFETs 2 successively operate row by row when respective drive pulses $\phi_{G1}$ to $\phi_{G3}$ sent from the vertical scanning circuit 34 are applied thereto.

The reset elements 31b are provided for the respective pixels 31. The reset drains 4, which are disposed in parallel to each other row by row, of all the pixels are commonly connected to a power-supply voltage $V_{RD}$ by way of reset drain lines extending along the row direction and a line 36 commonly connecting all the reset drain lines, whereas the reset gates (reset gate electrodes) 5 of all the pixels are commonly connected to the drive pulse generating circuit 37 by way of reset gate lines extending along the row direction and a line 37a commonly connecting all the reset gate lines. When the drive pulse $\phi_{RG}$ sent from the drive pulse generating circuit 37 is applied to the reset gate 5, the reset element 31b operates, whereby the gate region of the JFET 2 is initialized.

The vertical source lines 32a, 32b, and 32c in the respective columns are connected to one terminals of the capacitors for storing light signal output (second memory elements) $C_{S1}$, $C_{S2}$, and $C_{S3}$ by way of the MOS transistors for transferring light signal output $T_{S1}$, $T_{S2}$, and $T_{S3}$ and to one terminals of the capacitors for storing dark output (first memory elements) $C_{D1}$, $C_{D2}$, and $C_{D3}$ by way of the MOS transistors for transferring dark output $T_{D1}$, $T_{D2}$, and $T_{D3}$; while being connected to the signal output line 38 and the dark output line 39 by way of their corresponding MOS transistors for selecting horizontal readout $T_{HS1}$, $T_{HS2}$, $T_{HS3}$, $T_{HD1}$, $T_{HD2}$, and $T_{HD3}$. The other terminals of the capacitors $C_{S1}$, $C_{S2}$, $C_{S3}$, $C_{D1}$, $C_{D2}$, and $C_{D3}$ are grounded (set to GND). In general, the parasitic capacitances $C_{HS}$ and $C_{HD}$ respectively exist in the signal output line 38 and the dark output line 39. Also, the buffer amplifiers 38a and 39a are respectively connected to the signal output line 38 and the dark output line 39.

On the other hand, the signal output line 38 and the dark output line 39 are respectively connected to the MOS transistors $T_{RHS}$ and $T_{RHD}$ for resetting the signal output line 38 and the dark output line 39. Also, the other terminals of the MOS transistor $T_{RHS}$ and $T_{RHD}$ are grounded (set to GND). The MOS transistors $T_{RHS}$ and $T_{RHD}$ operate when the drive pulse $\phi_{RH}$ sent from the drive pulse generating circuit 43 is applied to their gate electrodes.

The gate electrodes of the MOS transistors for selecting horizontal readout $T_{HS1}$, $T_{HS2}$, $T_{HS3}$, $T_{D1}$, $T_{D2}$, and $T_{HD3}$ in the same columns are commonly connected to the respective horizontal selection lines 40a, 40b, and 40c which are connected to a horizontal scanning circuit 40. The horizontal readout operations are controlled by the drive pulses $\phi_{H1}$ to $\phi_{H3}$ sent from the horizontal scanning circuit 40.

The gate electrodes of the MOS transistors for transferring light signal output $T_{S1}$, $T_{S2}$, and $T_{S3}$ and the gate electrodes of the MOS transistors for transferring dark output $T_{D1}$, $T_{D2}$, and $T_{D3}$ are respectively connected to the drive pulse generating circuits 41 and 42 by way of the clock line for light signal 41a and the clock line for dark output 42a. The MOS transistors for transferring light signal output $T_{S1}$, $T_{S2}$, and $T_{S3}$ and the MOS transistors for transferring dark output $T_{D1}$, $T_{D2}$, and $T_{D3}$ alternately operate in a predetermined order when their corresponding drive pulses $\phi_{TS}$ and $\phi_{TD}$ sent from the drive pulse generating circuit 41 and 42 are applied thereto.

On the other hand, the vertical source lines 32a, 32b, and 32c in the respective columns are connected to the reset transistors $T_{RV1}$, $T_{RV2}$, and $T_{RV3}$ and the constant current sources 44a, 44b, and 44c for source-follower readout operation. Also, the power-supply voltage $V_{RV}$ is supplied to the reset transistors $T_{RV1}$, $T_{RV2}$, and $T_{RV3}$, whereas the power-source voltage $V_{CS}$ is supplied to the constant current sources 44a, 44b, and 44c for source-follower readout operation.

Here, the reset pulse $\phi_{RV}$ is supplied to the gate electrodes of the reset transistors $T_{RV1}$, $T_{RV2}$, and $T_{RV3}$ such that, when the reset pulse $\phi_{RV}$ becomes the high level, the reset transistors $T_{RV1}$, $T_{RV2}$, and $T_{RV3}$ are turned on, whereby the vertical source lines 32a, 32b, and 32c are grounded (in cases where $V_{RV}$=GND).

Also, the constant current sources 44a, 44b, and 44c for source-follower readout operation control the time constant for source-follower operations, while suppressing variations in the time constant due to fluctuations in bias points and the like of the respective pixels 31, thereby equalizing the gains so as to suppress the FPN.

In the following, the operation of the photoelectric conversion apparatus shown in FIG. 23 will be explained with reference to the pulse timing chart shown in FIG. 24. In FIG. 24, the duration from $t_{11}$ to $t_{15}$ represents the readout operation of pixels 31 in the first row, and durations from $t_{21}$ to $t_{25}$ and from $t_{31}$ to $t_{35}$ thereafter respectively correspond to the second and third rows. Also, $t_{11}$ to $t_{14}$ respectively correspond to periods for row selection and initialization operation of the JFETs 2, the source-follower operation of the JFETs 2 in the first row after the initialization, the transfer operation of signal charges from the photodiodes 1 to the JFETs 2, and the source-follower operation of the JFETs 2 after the transfer. These four operations are performed in a horizontal blanking period. Also, $t_{15}$ is the image signal output period.

First, as shown in FIG. 24, in the period $t_{11}$, each of the drive pulses $\phi_{RG}$ and $\phi_{TD}$ is set to the high level, thereby shifting the reset gate 5 of each pixel from the conductive (on) state to the non-conductive (off) state, while placing the MOS transistors for transferring dark output $T_{D1}$, $T_{D2}$, and $T_{D3}$ into the conductive (on) state.

Consequently, the gate regions of all the JETs 2 are set to the potential of the power-supply voltage $V_{RD}$ connected thereto by way of the reset drains 4 and row line 36 so as to be initialized (charges are drained therefrom), thus turning into a floating state.

Then, at the start of period $t_{12}$, the drive pulse $\phi_{G1}$ is set to the high level, so as to raise the potential of the gate electrodes of the JFETs 2 in the first row such that they are selected (turned on), whereas the JFETs 2 in the second and later rows are not selected (turned off). Namely, when the reset gates 5 are in the non-conductive (off) state, the JFETs 2 are selected (turned on) and not selected (turned off) according to the drive pulses ($\phi_{G1}$, $\phi_{G2}$, and $\phi_{G3}$) sent to the gate electrodes of the JFETs 2 in their corresponding rows.

At the same time (at the start of period $t_{12}$), the drive pulse $\phi_{RV}$ is set to the low level so as to place the reset transistors $T_{RV1}$ to $T_{RV3}$ into the interrupted (off) state. During this period $t_{12}$, each JFET 2 in the first row performs the source-follower operation. Here, during this period $t_{12}$, the drive pulse $\phi_{TD}$ is at the high level so as to keep the MOS transistors for transferring dark output $T_{D1}$, $T_{D2}$, and $T_{D3}$ in the conductive (on) state, whereby the output (output at dark) voltages corresponding to the potentials immediately after the initialization of the gate regions of the JFETs 2 are respectively stored in the capacitors for storing dark output $C_{D1}$, $C_{D2}$, and $C_{D3}$.

In the period $t_{13}$, the drive pulse $\phi_{TG1}$ is set to the low level so as to shift the transfer gates 3 from the non-conductive (off) state to the conductive (on) state, while the drive pulses $\phi_{TS}$ and $\phi_{TD}$ are respectively set to the high and low levels so as to place the MOS transistors for transferring light signal output $T_{S1}$, $T_{S2}$, and $T_{S3}$ into the conductive (on) state and the MOS transistors for transferring dark output $T_{D1}$, $T_{D2}$, and $T_{D3}$ into the non-conductive (off) state.

As a result, signal charges generated and stored in the photodiodes 1 in the first row are transferred to the gate regions of the JFETs 2. Here, the potential of the gate region of each JFET 2 after the charge transfer changes (increases in this case) by the value of signal charge amount/gate capacitance. In FIG. 24, the reason why the transfer gates 3 and reset gates 4 become the conductive (on) state when the drive pulse $\phi_{TG1}$ to $\phi_{TG1}$ and $\phi_{RG}$ are at the low level is that, since the transfer control element 31a and the reset element 31b are of p-channel type, its polarity becomes opposite to that of the other drive pulses.

In the period $t_{14}$, as with the period $t_{12}$, the drive pulse $\phi_{TG1}$ is set to the high level so as to place the transfer gates 3 in the first row into the non-conductive (off) state, thereby causing the signal charges photoelectrically converted by the photodiodes 1 to be stored; while the drive pulse $\phi_{RV}$ is set to the low level so as to place the reset transistors $T_{RV1}$ to $T_{RV3}$ into the interrupting (off) state. Then, the JFETs 2 in the first row perform the source-follower operation.

Here, during the period $t_{14}$, since the drive pulse $\phi_{TS}$ is at the high level, the MOS transistors for transferring light signal output $T_{S1}$, $T_{S2}$, and $T_{S3}$ are in the conductive (on) state, whereby the output (signal output) voltages corresponding to the potentials immediately after the signal charges are transferred to the gate regions of the JFETs 2 are respectively stored in the capacitors for storing light signal output $C_{S1}$, $C_{S2}$, and $C_{S3}$.

In the period $t_{15}$, each of the drive pulses $\phi_{G1}$, $\phi_{RG}$, and $\phi_{TS}$ is set to the low level, while the drive pulse $\phi_{RV}$ is set to the high level, so that the output voltages (image signals) stored in the capacitors for storing light signal output $C_{S1}$ to $C_{S3}$ and capacitors for storing dark output $C_{D1}$ to $C_{D3}$ are ready to be fed to their corresponding output terminals $V_{OS}$ and $V_{OD}$.

Then, the drive pulses $\phi_{H1}$ to $\phi_{H3}$ from the horizontal scanning circuit 40 and the drive pulse $\phi_{RH}$ from the drive pulse generating circuit 43 are sequentially transmitted, whereby the image signals stored in the capacitors for storing light signal output $C_{S1}$ to $C_{S3}$ and capacitors for storing dark output $C_{D1}$ to $C_{D3}$ are read out into the horizontal signal lines of the signal output line 38 and dark output line 39, respectively, outputting the image signals from the output terminals $V_{OS}$ and $V_{OD}$, and then the signal output line 38 and dark output line 39 are reset.

Here, the image signals obtained from the output terminals $V_{OS}$ and $V_{OD}$ are subjected to arithmetic processing by an external arithmetic circuit not depicted. The image signal obtained from the output terminal $V_{OS}$ contains a signal charge component (S) and a dark component (D), while the image signal obtained from the output terminal $V_{OD}$ contains only the dark component (D). Accordingly, the image signals obtained from the output terminals $V_{OS}$ and $V_{OD}$ are subjected to the arithmetic processing (subtraction ($V_{OS} - V_{OD}$)) in order to extract only the image signal corresponding to the signal charge component (S).

The readout operation for the first row in the foregoing periods $t_{11}$ to $t_{15}$ is similarly repeated for the second and third rows in the periods $t_{21}$ to $t_{25}$ and the periods $t_{31}$ to $t_{35}$, respectively. Here, in the photoelectric conversion apparatus shown in FIG. 23, since the reset elements 31a are provided for the respective pixels 31, while the reset drains 4 are disposed in parallel to each other in each row, the reset operation becomes very fast. Accordingly, the total time of the periods $t_{11}$ to $t_{15}$, $t_{21}$ to $t_{25}$, and $t_{31}$ to $t_{35}$ can be made shorter than that in the conventional photoelectric conversion apparatus.

In this embodiment, as with Embodiment 1, the drain shunt lines 100 are formed at a rate of 1 line to a plurality of columns. Also, in the columns where no shunt lines 100 are formed, the electrically floating light-shielding dummy lines 200 made of an aluminum film or the like, which are not connected to the drain regions 17 (i.e., having no drain contact), are continuously formed along the column direction. Accordingly, in this embodiment, as with Embodiment 1, the high yield in manufacture is attained, while the sensitivity is prevented from fluctuating. Here, the dummy lines 200 may be formed intermittently in the column direction as in the case of Embodiment 2.

Embodiment 7

Figure 25:
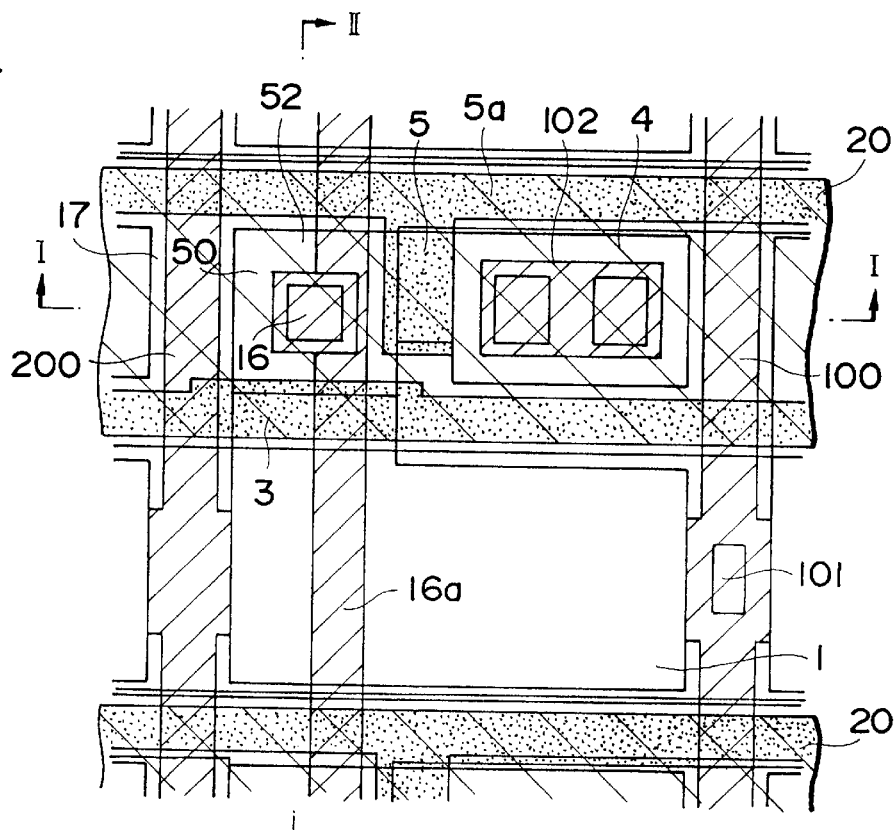
FIGS. 25 to 27 are schematic configurational views showing a unit pixel in the photoelectric conversion apparatus in accordance with Embodiment 7 of the present invention.
Figure 26:
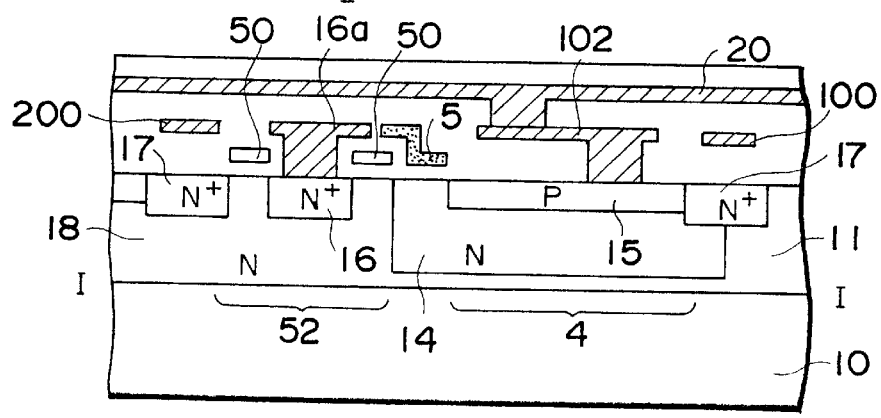
Figure 27:
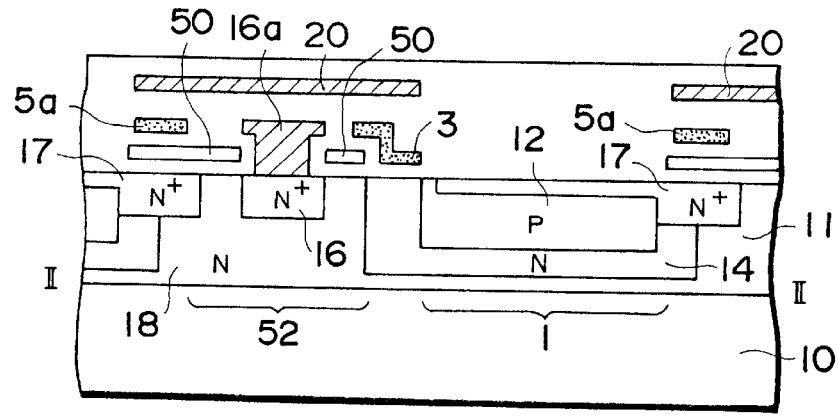
Figure 28:
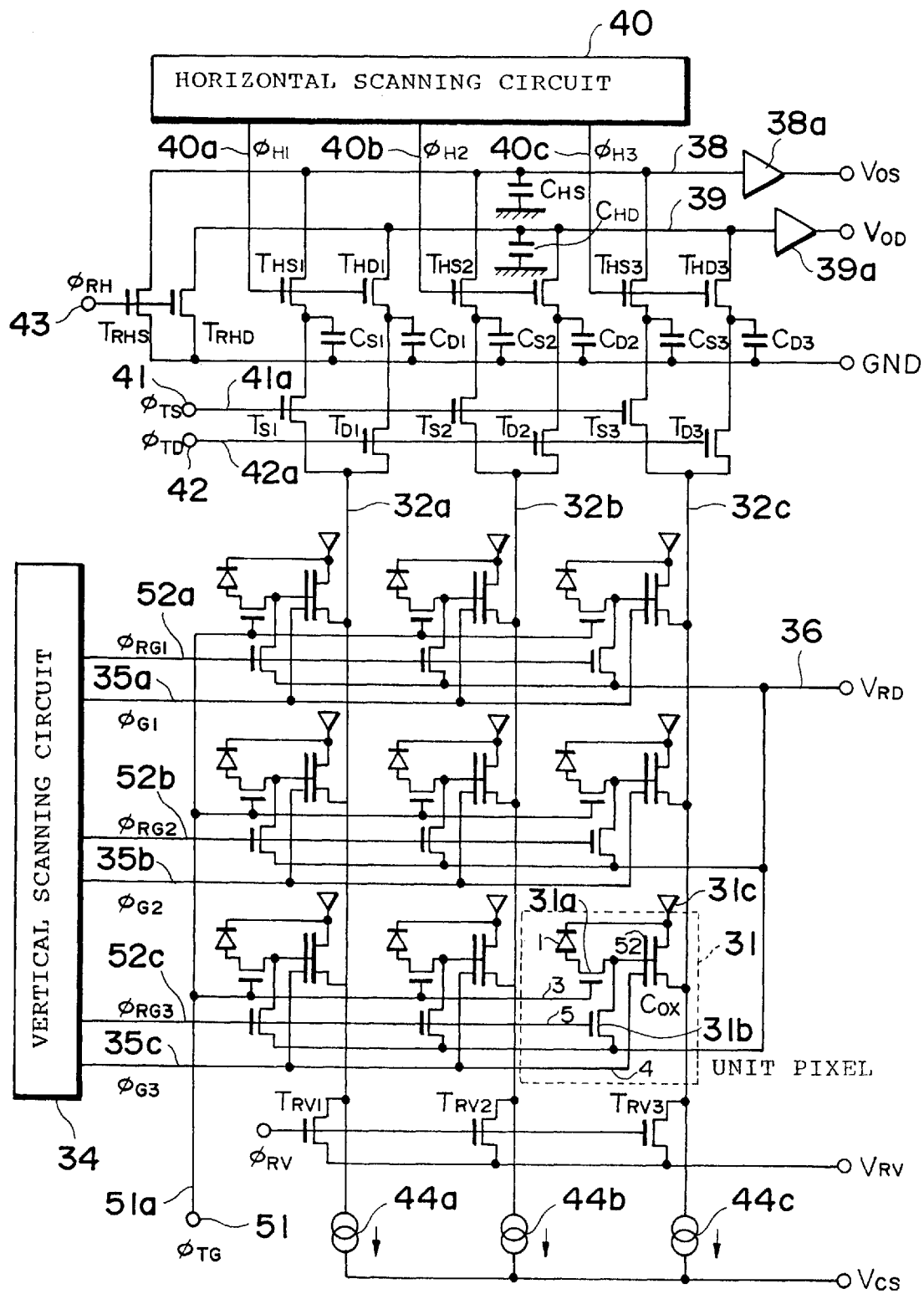
FIG. 28 is a circuit diagram showing the schematic configuration of the photoelectric conversion apparatus in accordance with Embodiment 7 of the present invention.
Figure 29:
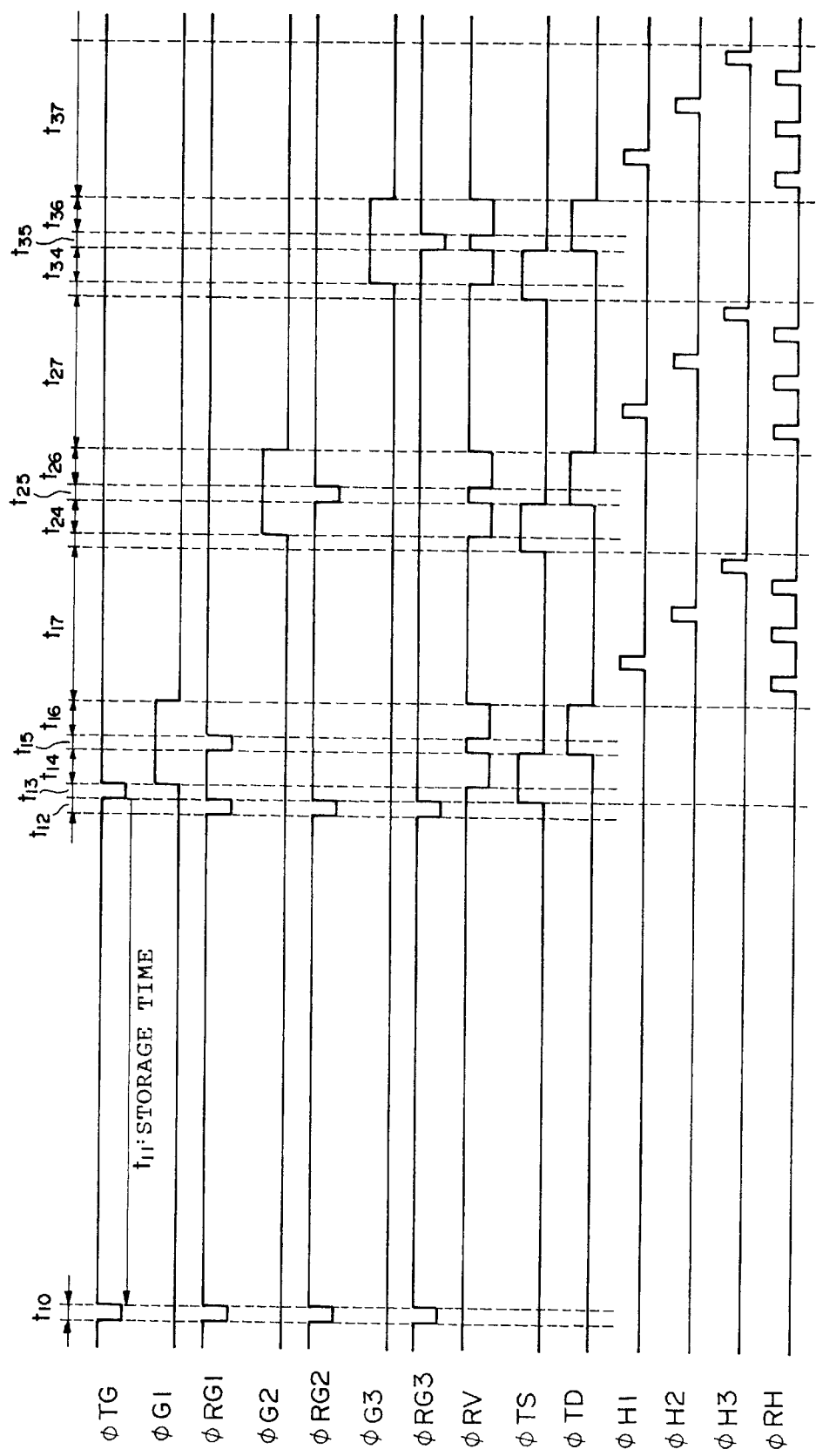
FIG. 29 is a pulse timing chart for explaining the operation of the circuit diagram shown in FIG. 28.

FIGS. 25 to 27 are schematic configurational views showing one of individual photoelectric conversion elements (unit pixels) arranged in a two-dimensional matrix in the photoelectric conversion apparatus in accordance with Embodiment 7 of the present invention, respectively corresponding to a schematic plan view thereof, a cross-sectional view taken along I—I line of FIG. 25, and a cross-sectional view taken along II—II line of FIG. 25. FIG. 28 is a circuit diagram showing the schematic configuration of the photoelectric conversion apparatus in accordance with this embodiment. FIG. 29 is a pulse timing chart for explaining the operation of the circuit diagram shown in FIG. 28.

The photoelectric conversion element in the photoelectric conversion apparatus in accordance with this embodiment differs from that of Embodiment 1 only in that a depletion type MOS transistor 52 is used in its amplifying portion.

Since the MOS transistor performs a so-called nondestructive amplification without destroying the charge (signal charge) during its amplification operation, like JFET 2, it has a property of rarely generating FPN. Further, the MOS transistor yields no residual charge in the control region (the surface of silicon (n-type silicon layer) under the gate electrode) when the signal charge is reset, thereby exhibiting a property of rarely generating the image lag and reset noise. Accordingly, it is suitable for constituting a solid-state imaging device enabling an electronic shutter operation which establishes simultaneity in a frame.

In the photoelectric conversion apparatus in this embodiment, photoelectric conversion elements, one of which is shown in FIGS. 25 to 27, are arranged in a two-dimensional matrix. When FIG. 28 showing its circuit diagram is compared with FIG. 9, the photoelectric conversion apparatus shown in FIG. 28 and that explained with reference to FIG. 9 are found to be different from each other in that the amplifying portion of each pixel 31 is constituted by the MOS transistor 52, the transfer gates 3 of the transfer control elements 31a in all the pixels are commonly connected to a drive pulse generating circuit 51 by way of a row line 51a, and the reset gates 5 of the reset elements 31b are arranged so as to operate row by row according to the drive pulses ($\phi_{RG1}$ to $\phi_{RG3}$) sent from the vertical scanning circuit 34 respectively by way of clock lines 52a, 52b, and 52c. The configuration shown in FIG. 28 can realize a photoelectric conversion apparatus enabling an electronic shutter operation which establishes simultaneity in a frame.

In the following, with reference to the pulse timing chart of FIG. 29, the operation of the photoelectric conversion apparatus shown in FIG. 28 will be explained. First, as shown in FIG. 29, in the period $t_{10}$, each of the drive pulses $\phi_{TG}$ and $\phi_{RG1}$ to $\phi_{RG3}$ is set to the low level, thereby shifting the transfer gate 3 and reset gate 5 of each pixel 31 from the non-conductive (off) state to the conductive (on) state.

As a result, all the photodiodes 1 and reset drains 4 as well as the control regions of all the MOS transistors 52 and the reset drains 4 are electrically connected together, whereby the photodiodes 1 are depleted to be initialized, while the control regions of the MOS transistors 52 are initialized to the potential of the reset drains 4.

Then, in the period $t_{11}$, each of the drive pulses $\phi_{TG}$ and $\phi_{RG1}$ to $\phi_{RG3}$ is set to the high level so as to place the transfer gate 3 and reset gate 5 of each pixel 31 into the non-conductive (off) state, thereby causing the photodiode 1 to store the charge. Thus, the period $t_{11}$ becomes a shutter time.

Then, in the period $t_{12}$, each of the drive pulses $\phi_{TG}$ and $\phi_{RG1}$ to $\phi_{RG3}$ is set to the low level again so as to shift the transfer gate 3 and reset gate 5 of each pixel 31 from the non-conductive (off) state to the conductive (on) state. As a result, the MOS transistors 52 are set to the potential of the reset drains 4 connected to the power-supply voltage $V_{RD}$ by way of the row line 36. Accordingly, the dark currents generated in the MOS transistors 52 during the period $t_{11}$ are eliminated, whereby the MOS transistors 52 are initialized again. This initialization operation of the MOS transistors 52 is necessary for long-time storage in the photodiodes 1 in the case of imaging of a still picture mode.

In the period $t_{13}$, the drive pulse $\phi_{TS}$ is set to the high level so as to place the MOS transistors for transferring light signal output $T_{S1}$, $T_{S2}$, and $T_{S3}$ into the conductive (on) state, each of the drive pulses $\phi_{RG1}$ to $\phi_{RG1}$ is set to the high level so as to place the reset gate 5 of each pixel 31 into the non-conductive (off) state, and the driving pulse $\phi_{TG}$ is set to the low level so as to place the transfer gate 3 of each pixel to the conductive (on) state. As a result, the charge generated and stored in the period $t_{11}$ is transferred from the photodiodes 1 to the control regions of the MOS transistors.

Then, in the periods $t_{14}$ to $t_{17}$, substantially in the same manner as in the photoelectric conversion apparatus shown in FIG. 9, the readout operations for the pixels in the first row are performed. Namely, the operation of the photoelectric conversion apparatus shown in FIG. 28 in the periods $t_{14}$ to $t_{17}$ corresponds to that of the photoelectric conversion apparatus shown in FIG. 9 in the periods $t_{12}$ to $t_{15}$.

Namely, in the period $t_{14}$, in the photoelectric conversion apparatus shown in FIG. 28, the drive pulse $\phi_{G1}$ is set to the high level so as to raise the potential of the gate electrodes operated by capacitive coupling, whereas the drive pulse $\phi_{RV}$ is set to the low level so as to place the reset transistors $T_{RV1}$ to $T_{RV3}$ into the interrupted (off) state, whereby each MOS transistor 52 in the first row performs the source-follower operation (charge amplification operation by capacitive load). Here, the MOS transistors 52 are selected (turned on) and not selected (turned off) row by row according to the drive pulses ($\phi_{G1}$, $\phi_{G2}$, and $\phi_{G3}$) sent to the gate electrodes.

Also, during this period $t_{14}$, the drive pulse $\phi_{TS}$ has already been at the high level so as to keep the MOS transistors for transferring light signal output $T_{S1}$, $T_{S2}$, and $T_{S3}$ in the conductive (on) state, whereby the output (signal output) voltages corresponding to the potentials immediately after the charges are transferred to the control regions of the MOS transistors 52 are respectively stored in the capacitors for storing light signal output $C_{S1}$, $C_{S2}$, and $C_{S3}$.

Subsequently, in the period $t_{15}$, in the photoelectric conversion apparatus shown in FIG. 28, the drive pulse $\phi_{TD}$ is set to the high level so as to place the MOS transistors for transferring dark output $T_{D1}$, $T_{D2}$, and $T_{D3}$ into the conductive (on) state, and the drive pulse $\phi_{RG}$ is set to the low level. Thus, the reset gates 5 in the first row are placed into the conductive (on) state, whereby the control regions of the MOS transistors 52 in the first row are reset (charges are drained therefrom).

Further, in the period $t_{16}$, in the photoelectric conversion apparatus shown in FIG. 28, the drive pulse $\phi_{RV}$ is set to the low level again so as to place the reset transistors $T_{RV1}$ to $T_{RV3}$ into the interrupted (off) state. Thus, the MOS transistors 52 in the first row perform the source-follower operation after resetting.

Here, during the period $t_{16}$, in the photoelectric conversion apparatus shown in FIG. 28, since the drive pulse $\phi_{TD}$ has already been at the high level, the MOS transistor for transferring dark output $T_{D1}$, $T_{D2}$, and $T_{D3}$ are in the conductive (on) state. Accordingly, the output (output at dark) voltages corresponding to the potentials immediately after the resetting of the control regions of the MOS transistors 52 are respectively stored in the capacitors for storing dark output $C_{D1}$, $C_{D2}$, and $C_{D3}$.

Then, in the period $t_{17}$, in the photoelectric conversion apparatus shown in FIG. 28, each of the drive pulses $\phi_{G1}$ and $\phi_{TD}$ is set to the low level, while the drive pulse $\phi_{RV}$ is set to the high level, so that the output voltages (image signals) stored in the capacitors for storing light signal output $C_{S1}$ to $C_{S3}$ and capacitors for storing dark output $C_{D1}$ to $C_{D3}$ are ready to be fed to their corresponding output terminals $V_{OS}$ and $V_{OD}$. Also, in the photoelectric conversion apparatus shown in FIG. 28, the drive pulses $\phi_{H1}$ to $\phi_{H3}$ from the horizontal scanning circuit 40 and the drive pulse $\phi_{RH}$ from the drive pulse generating circuit 43 are sequentially transmitted, whereby the image signals stored in the capacitors for storing light signal output $C_{S1}$ to $C_{S3}$ and capacitors for storing dark output $C_{D1}$ to $C_{D3}$ are read out into the horizontal signal lines of the signal output line 38 and dark output line 39, respectively, outputting the image signals from the output terminals $V_{OS}$ and $V_{OD}$, and then the signal output line 38 and dark output line 39 are reset.

In this manner, the readout operation for the first row is completed, and the readout operations for the second and third rows are performed in the periods $t_{24}$ to $t_{27}$ and the periods $t_{34}$ to $t_{37}$, respectively.

Though the photoelectric conversion apparatus shown in FIG. 28 is explained mainly in conjunction with the case where still pictures are captured, it is also applicable to the case where moving pictures are captured. Namely, the electronic shutter operation can also be effected in the case where moving pictures are captured. In the latter case, however, since the operation of the period $t_{10}$ to $t_{13}$ (while the period $t_{12}$ being unnecessary in the case of the moving pictures) shown in FIG. 29 needs to be performed within a vertical blanking period, there is a certain limitation on the range within which the shutter speed is variable.

Also, the photoelectric conversion apparatus shown in FIG. 28 (enabling an electronic shutter operation which establishes simultaneity in a frame) can employ not only the MOS type photoelectric conversion elements but also JFET type or bipolar type photoelectric conversion elements as long as they have a structure which is operable by capacitive coupling. Nevertheless, since a reset operation is interposed between two source-follower operations, the MOS type photoelectric conversion elements which do not generate reset noise are most preferable.

In this embodiment, as with Embodiment 1, the drain shunt lines 100 commonly connecting the drain regions of the MOS transistors 52 column by column along the column direction are formed at a rate of 1 line to a plurality of columns. Also, in the columns where no shunt lines 100 are formed, the electrically floating light-shielding dummy lines 200 made of an aluminum film or the like, which are not connected to the drain regions 17 (i.e., having no drain contact), are continuously formed along the column direction. Accordingly, in this embodiment, as with Embodiment 1, the high yield in manufacture is attained, while the sensitivity is prevented from fluctuating. Here, the dummy lines 200 may be formed intermittently in the column direction as in the case of Embodiment 2.

Embodiment 8

Figure 30:
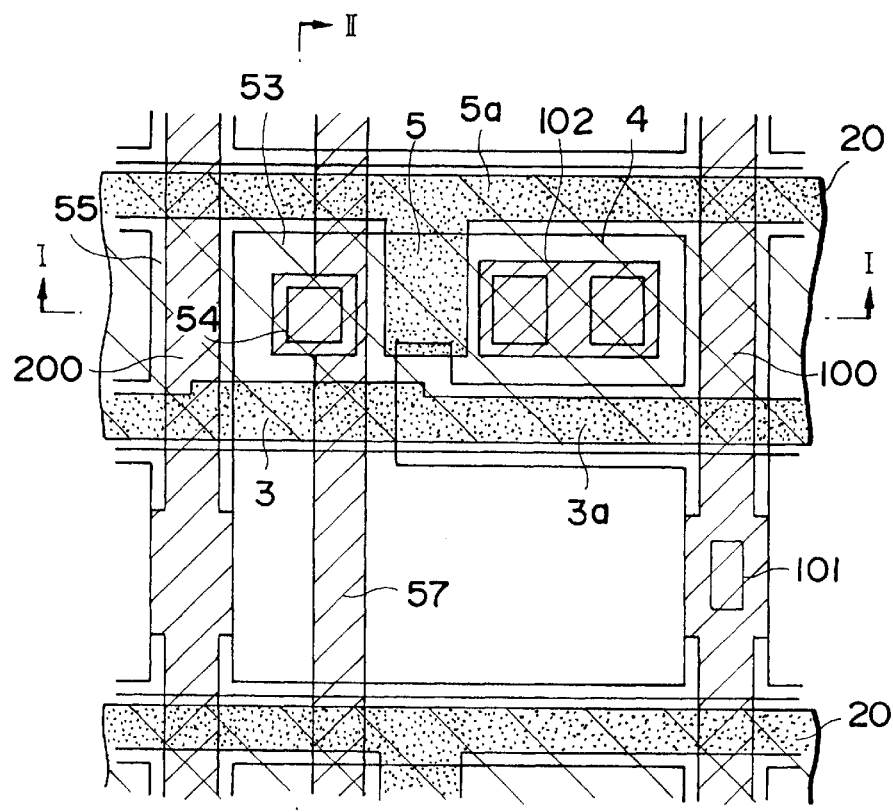
FIGS. 30 to 32 are schematic configurational views showing a unit pixel in the photoelectric conversion apparatus in accordance with Embodiment 8 of the present invention.
Figure 31:
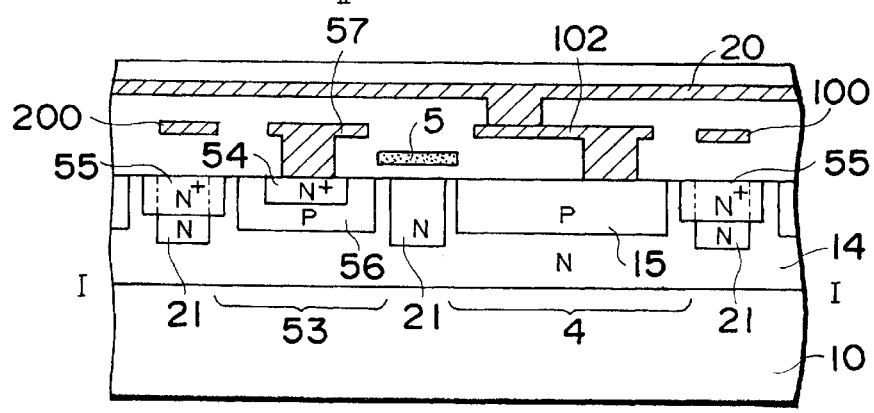
Figure 32:
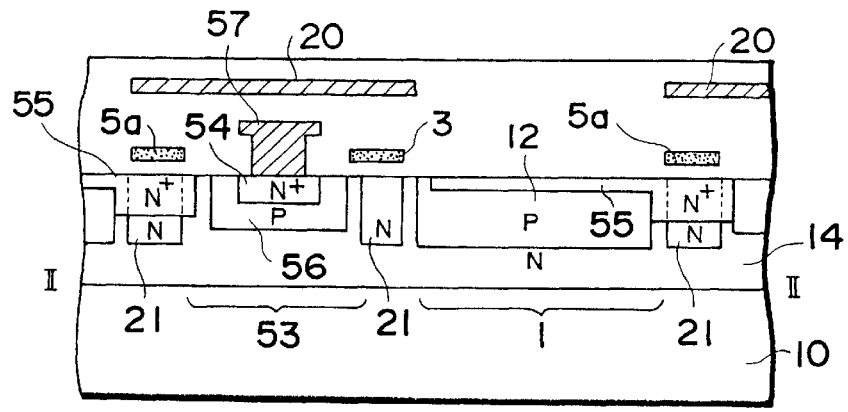

FIGS. 30 to 32 are schematic configurational views showing one of individual photoelectric conversion elements (unit pixels) arranged in a two-dimensional matrix in the photoelectric conversion apparatus in accordance with Embodiment 8 of the present invention, respectively corresponding to a schematic plan view thereof, a cross-sectional view taken along I—I line of FIG. 30, and a cross-sectional view taken along II—II line of FIG. 30.

The photoelectric conversion apparatus of this embodiment differs from that of Embodiment 1 only in the following point.

Namely, the photoelectric conversion element shown in FIGS. 30 to 32 differs from that shown in FIGS. 6 to 8 in that a bipolar transistor 53 is used in its amplifying portion. Here, as shown in FIGS. 30 to 32, an emitter 54, a collector 55, and a base 56 are constructed, while an emitter line 57 is formed. Here, the collector region 55 is continuously formed like a mesh so as to commonly connect all the photoelectric conversion elements (pixels) on the substrate along the column and row directions. Also, the emitter regions 54 of the respective bipolar transistors 53 in each column are commonly connected by the emitter line 57 made of an aluminum film or the like along the column direction.

In the bipolar transistor 53 shown in FIGS. 30 to 32, without any formation of the normally used n$^+$-type buried collector or the collector using a high-concentration n-type substrate, the collector region is disposed at the surface layer portion of the silicon (n-well region 14). Accordingly, the bipolar transistor 53 can be combined with the photodiode 1 of a vertical overflow type, whereby the output signals can be restrained from fluctuating due to blooming, smear, and the like.

Also, in this embodiment, since no electrode for driving the base region by capacitive coupling is formed, the capacitance of the control region becomes smaller, whereby a high sensitivity can be secured.

In this embodiment, as with Embodiment 1, the drain shunt lines 100 commonly connecting the collector regions 55 of the bipolar transistors 53 column by column along the column direction are formed at a rate of 1 line to a plurality of columns. Also, in the columns where no shunt lines 100 are formed, the electrically floating light-shielding dummy lines 200 made of an aluminum film or the like, which are not connected to the collector regions 55 (i.e., having no collector contact), are continuously formed along the column direction. Accordingly, in this embodiment, as with Embodiment 1, the high yield in manufacture is attained, while the sensitivity is prevented from fluctuating. Here, the dummy lines 200 may be formed intermittently in the column direction as in the case of Embodiment 2.

Embodiment 9

Figure 33:
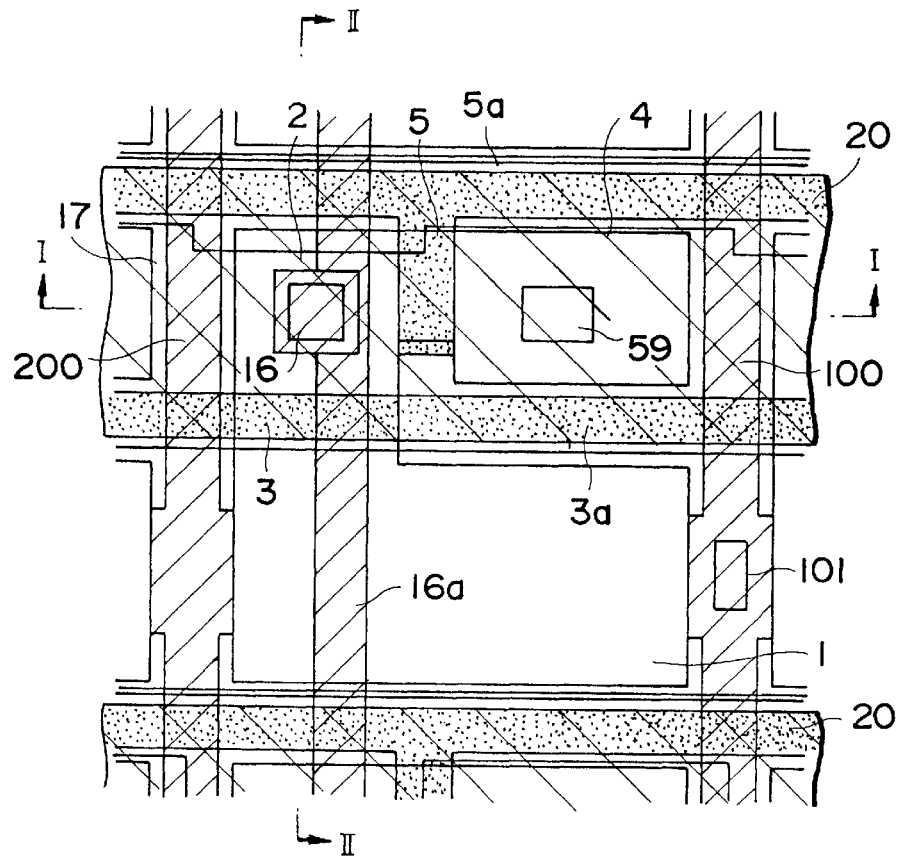
FIGS. 33 to 35 are schematic configurational views showing a unit pixel in the photoelectric conversion apparatus in accordance with Embodiment 9 of the present invention.
Figure 34:
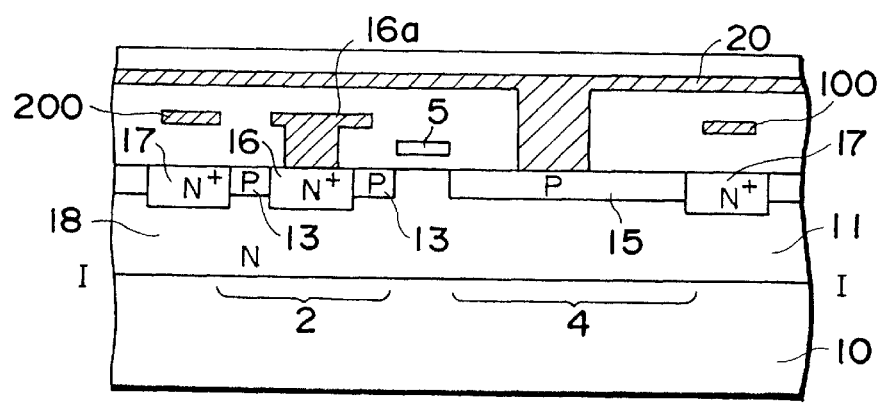
Figure 35:
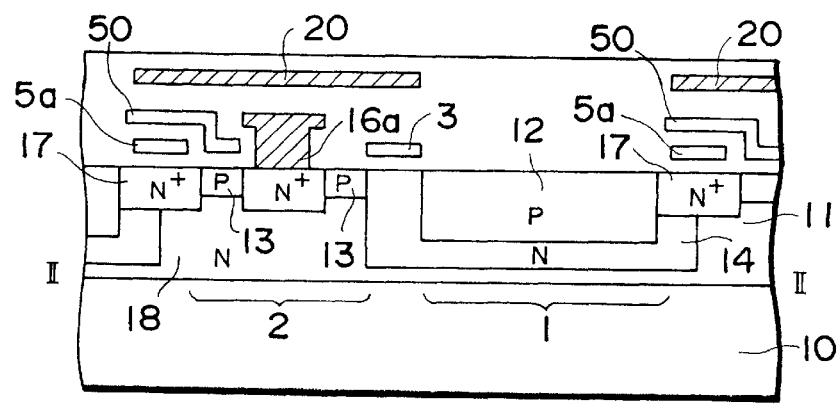

FIGS. 33 to 35 are schematic configurational views showing one of individual photoelectric conversion elements (unit pixels) arranged in a two-dimensional matrix in the photoelectric conversion apparatus in accordance with Embodiment 9 of the present invention, respectively corresponding to a schematic plan view thereof, a cross-sectional view taken along I—I line of FIG. 33, and a cross-sectional view taken along II—II line of FIG. 33.

The photoelectric conversion apparatus of this embodiment differs from that shown in FIGS. 20 to 24 only in the following point.

Namely, in the photoelectric conversion element shown in FIGS. 33 to 35, a metal line which is connected to the reset-purpose charge draining means (reset drain 4) and also serves as a light-shielding film (aluminum film 20) is directly connected to the p-type reset drain region 15 through a contact hole 59, without using the relay line 102. In such a configuration, the degree of integration in the photoelectric conversion element can be improved.

Though the embodiments of the present invention are explained in the foregoing, the present invention should not be restricted thereto.

For example, though the transfer control element 31a and the reset element 31b are assumed to be constituted by MOS field effect transistors (MOSFETs), similar effects can be obtained when they are constituted by bipolar transistors as well.

As explained in the foregoing, the present invention is effective in that a high yield in manufacture is obtained while the sensitivity is prevented from fluctuating.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 090516/1996 filed on Mar. 18, 1996 is hereby incorporated by reference.

What is claimed is:

1. A photoelectric conversion apparatus comprising:

a plurality of photoelectric conversion elements arranged in a two-dimensional matrix defined by a row direction and a column direction, each of said photoelectric conversion elements comprising:
   a photoelectric conversion portion for generating and storing a charge corresponding to an intensity of light received thereby, and
   an amplifying portion having a control region, said amplifying portion outputting a signal corresponding to the charge received from said photoelectric conversion portion at said control region;

a light-shielding shunt line commonly connecting the amplifying portions along the column direction, one shunt line being formed for a plurality of columns; and a light-shielding dummy line being electrically floating without connecting with said amplifying portions, said dummy line being formed in a column line being free of said shunt line.

2. A photoelectric conversion apparatus according to claim 1, wherein said dummy line is continuously formed along the column direction.

3. A photoelectric conversion apparatus according to claim 1, wherein a light-shielding film extending along the row direction is provided for each row, said dummy line being intermittently formed in the column direction so as to be missing in at least a part of a region in each row, said region intersecting with said light-shielding film.

4. A photoelectric conversion apparatus according to claim 3, wherein said light-shielding film is a row-selecting line which commonly connects reset portions along the row direction.

5. A photoelectric conversion apparatus according to claim 1, wherein said amplifying portion comprises a field effect transistor.

6. A photoelectric conversion apparatus according to claim 1, wherein said photoelectric conversion element further comprises:

a transfer control section for transferring the charge generated and stored by said photoelectric conversion portion to the control region of said amplifying portion;

reset-purpose charge draining means for draining the charge transferred to the control region of said amplifying portion; and reset-purpose control means for controlling said reset-purpose charge draining means.

* * * * *